(12) United States Patent
El Bouayadi et al.

(10) Patent No.: US 12,308,505 B2
(45) Date of Patent: May 20, 2025

(54) CONNECTING ELECTRICAL CIRCUITRY IN A QUANTUM COMPUTING SYSTEM

(71) Applicant: Rigetti & Co, LLC, Berkeley, CA (US)

(72) Inventors: Tristan Ossama El Bouayadi, Berkeley, CA (US); Damon Stuart Russell, Pasadena, CA (US); Jean-Philip Paquette, Berkeley, CA (US); Saniya Vilas Deshpande, Berkeley, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 24 days.

(21) Appl. No.: 17/723,147

(22) Filed: Apr. 18, 2022

(65) Prior Publication Data

US 2023/0067066 A1 Mar. 2, 2023

Related U.S. Application Data

(63) Continuation of application No. 16/903,609, filed on Jun. 17, 2020, now Pat. No. 11,342,646, which is a
(Continued)

(51) Int. Cl.
*H01P 3/08* (2006.01)
*G06N 10/00* (2022.01)
(Continued)

(52) U.S. Cl.
CPC ............... *H01P 3/08* (2013.01); *G06N 10/40* (2022.01); *H01P 1/30* (2013.01); *H05K 1/0203* (2013.01);
(Continued)

(58) Field of Classification Search
CPC .. H01P 3/08; H01P 1/30; G06N 10/00; H05K 1/0203; H05K 1/0243; H05K 1/0245;
(Continued)

(56) References Cited

U.S. PATENT DOCUMENTS 3,482,201 A * 12/1969 Schneck ................ H01R 31/00
439/631
5,041,003 A * 8/1991 Smith ................... H01R 12/714
174/117 FF
(Continued)

FOREIGN PATENT DOCUMENTS

WO 2016199029 12/2016

OTHER PUBLICATIONS

WIPO, International Search Report and Written Opinion mailed Sep. 11, 2018, in PCT/US2018/033031, 17 pgs.
(Continued)

*Primary Examiner* — Timothy J Thompson
*Assistant Examiner* — Michael F McAllister
(74) *Attorney, Agent, or Firm* — Henry Patent Law Firm PLLC

(57) ABSTRACT

In some aspects, a flexible cable may comprise: a flexible strip with first and second parallel surfaces and first and second ends, said flexible strip being electrically insulating; a metal stripline within said flexible strip; first and second metallic grounding planes on said first and second surfaces, respectively; and a first circuit board mechanically attached to at least one of said first end of said flexible strip and said first and second metallic grounding planes at said first end, said first circuit board being mechanically stiff, said metal stripline being electrically connected to electrical circuitry on said first circuit board.

18 Claims, 26 Drawing Sheets

Related U.S. Application Data continuation of application No. 15/981,731, filed on May 16, 2018, now Pat. No. 10,734,696.

(60) Provisional application No. 62/634,647, filed on Feb. 23, 2018, provisional application No. 62/594,928, filed on Dec. 5, 2017, provisional application No. 62/506,881, filed on May 16, 2017.

(51) Int. Cl.
| | |
|---|---|
| G06N 10/40 | (2022.01) |
| H01B 7/04 | (2006.01) |
| H01P 1/30 | (2006.01) |
| H01R 12/79 | (2011.01) |
| H05K 1/02 | (2006.01) |
| H05K 1/14 | (2006.01) |

(52) U.S. Cl.
CPC ......... *H05K 1/0243* (2013.01); *H05K 1/0245* (2013.01); *H05K 1/147* (2013.01); *H01B 7/04* (2013.01); *H01R 12/79* (2013.01); *H05K 1/0204* (2013.01); *H05K 1/025* (2013.01); *H05K 2201/1006* (2013.01)

(58) Field of Classification Search
CPC ...... H05K 1/147; H05K 1/0204; H05K 1/025; H05K 2201/1006; H01B 7/04; H01R 12/79
USPC ....................................................... 361/720
See application file for complete search history.

(56) References Cited

U.S. PATENT DOCUMENTS

| | | | | |
|---|---|---|---|---|
| 5,083,238 | A * | 1/1992 | Bousman | H05K 7/1441 174/268 |
| 5,156,553 | A * | 10/1992 | Katsumata | H01R 12/716 439/62 |
| 5,251,095 | A * | 10/1993 | Miller | H05K 7/20536 361/698 |
| 5,856,678 | A | 1/1999 | Hey-Shipton et al. | |
| 5,856,768 | A * | 1/1999 | Hey-Shipton | H01P 1/04 333/260 |
| 6,055,722 | A * | 5/2000 | Tighe | H05K 9/0039 29/842 |
| 6,202,439 | B1 | 3/2001 | Mikheev et al. | |
| 6,366,185 | B1 * | 4/2002 | Keesey | H01P 5/085 333/260 |
| 6,930,240 | B1 * | 8/2005 | Giboney | H01R 12/594 439/497 |
| 7,429,702 | B2 * | 9/2008 | Kobayashi | H05K 1/0219 174/117 FF |
| 9,524,470 | B1 * | 12/2016 | Chow | H10N 60/12 |
| 10,141,493 | B2 * | 11/2018 | Tuckerman | H10N 60/20 |
| 10,269,469 | B2 * | 4/2019 | Yosui | H01P 3/026 |
| 10,681,842 | B1 | 6/2020 | Hart et al. | |
| 10,734,696 | B2 | 8/2020 | El Bouayadi et al. | |
| 10,855,010 | B2 * | 12/2020 | Kato | H01R 12/53 |
| 2004/0108921 | A1 * | 6/2004 | Sacco | H01P 3/121 333/239 |
| 2004/0159460 | A1 * | 8/2004 | Passiopoulos | H05K 1/0237 174/117 FF |
| 2005/0012199 | A1 * | 1/2005 | Rosenau | H05K 1/189 257/688 |
| 2005/0136703 | A1 * | 6/2005 | Van Schuylenbergh | H05K 1/147 439/67 |
| 2005/0256007 | A1 | 11/2005 | Amin et al. | |
| 2007/0066126 | A1 * | 3/2007 | Dutta | H05K 1/024 439/493 |
| 2009/0000804 | A1 * | 1/2009 | Kobayashi | H01P 3/08 174/117 F |
| 2010/0182105 | A1 * | 7/2010 | Hein | H01P 3/003 333/239 |
| 2012/0132458 | A1 * | 5/2012 | Sekine | H05K 1/0393 174/254 |
| 2013/0121702 | A1 * | 5/2013 | Han | H03F 3/24 398/115 |
| 2014/0014409 | A1 * | 1/2014 | Lin | H05K 1/117 174/75 R |
| 2014/0111291 | A1 * | 4/2014 | Kinpara | H01P 3/006 333/246 |
| 2014/0147128 | A1 | 5/2014 | Han et al. | |
| 2014/0262448 | A1 * | 9/2014 | Kato | H05K 1/0298 174/250 |
| 2015/0018055 | A1 * | 1/2015 | Yosui | H05K 1/0221 174/254 |
| 2015/0091676 | A1 * | 4/2015 | Kato | H01P 1/047 333/260 |
| 2015/0229016 | A1 | 8/2015 | Biddle | |
| 2016/0007510 | A1 * | 1/2016 | Cheng | H05K 9/0088 428/335 |
| 2016/0087598 | A1 | 3/2016 | Thom et al. | |
| 2016/0087698 | A1 | 3/2016 | Thom et al. | |
| 2016/0125311 | A1 * | 5/2016 | Fuechsle | H10N 69/00 257/31 |
| 2016/0268666 | A1 * | 9/2016 | Wakabayashi | H01P 3/082 |
| 2016/0362627 | A1 * | 12/2016 | Worthington | C10M 129/26 |
| 2016/0372811 | A1 * | 12/2016 | Yosui | H01P 1/203 |
| 2017/0125870 | A1 * | 5/2017 | Baba | H05K 1/111 |
| 2017/0149111 | A1 * | 5/2017 | Yosui | H01P 3/082 |
| 2018/0048044 | A1 * | 2/2018 | Ou | H01P 3/006 |
| 2018/0083334 | A1 | 3/2018 | Petrovic et al. | |
| 2018/0270949 | A1 | 9/2018 | Fukumori | |
| 2018/0294401 | A1 * | 10/2018 | Tuckerman | H10N 60/80 |
| 2019/0157763 | A1 * | 5/2019 | Kato | H01P 5/028 |
| 2019/0267692 | A1 * | 8/2019 | Roberts | H01P 3/08 |
| 2021/0111470 | A1 | 4/2021 | El Bouayadi et al. | |

OTHER PUBLICATIONS

USPTO, Third Party Submission filed Apr. 10, 2019, in U.S. Appl. No. 15/981,731, 51 pgs.
EPO, Extended European Search Report mailed Jan. 28, 2021, in EP 18801848.5, 9 pgs.
Delft Circuits, "Cryogenic Circuit Technologies", Brochure distributed at APS March Meeting, Mar. 2017, 5 pages.
Geller, M. R., et al., "Quantum Computing with Superconductors I: Architectures", arXiv:quant-ph/0603224v1, Mar. 24, 2006, 24 pages.
Liu, et al., "Common-Mode Filters with Interdigital Fingers for Harmonics Suppression and Lossy Materials for Broadband Suppression", IEEE Transactions on Electromagnetic Compatibility, vol. 57, No. 6, Dec. 6, 2015, 9 pgs.
National Security Agency, "Superconducting Technology Assessment", Office of Corporate Assessments, dated Aug. 2005, 257 pgs.
Rodger, D. C., "Flexible Circuit Technologies for Biomedical Applications", Advances in Micro/Nano Electromechanical Systems and Fabrication Technologies, May 2013, 41 pages.
Tuckerman, D. B., et al., "Flexible superconducting Nb transmission lines on thin film polyimide for quantum computing applications", Supercond. Sci. Technol. 29 (2016) 084007, Jul. 11, 2016, 13 pages.
Van Weers, et al., "Niobium flex cable for low temperature high density interconnects", Cryogenics 55-56, 1-4, 2013, 4 pgs.
Walter, et al., "Laminated NbTi-on-Kapton Microstrip Cables for Flexible Sub-Kelvin RF Electronics", IEEE Transactions on Applied Superconductivity, vol. 28, No. 1, Jan. 2018, 5 pgs.
Webber, R. J., et al., "Operation of YBCO current leads as bias lines to cryocooler-mounted 4 K superconducting electronics", Physics Procedia 36 (2012) 256-261, 2012, 6 pages.
EPO, Communication pursuant to Article 94(3) issued in Application No. 18801848.5 on Mar. 21, 2024, 4 pages.
EPO, Extended European Search Report issued in Application No. 24211641.6 on Feb. 12, 2025, 9 pages.

* cited by examiner

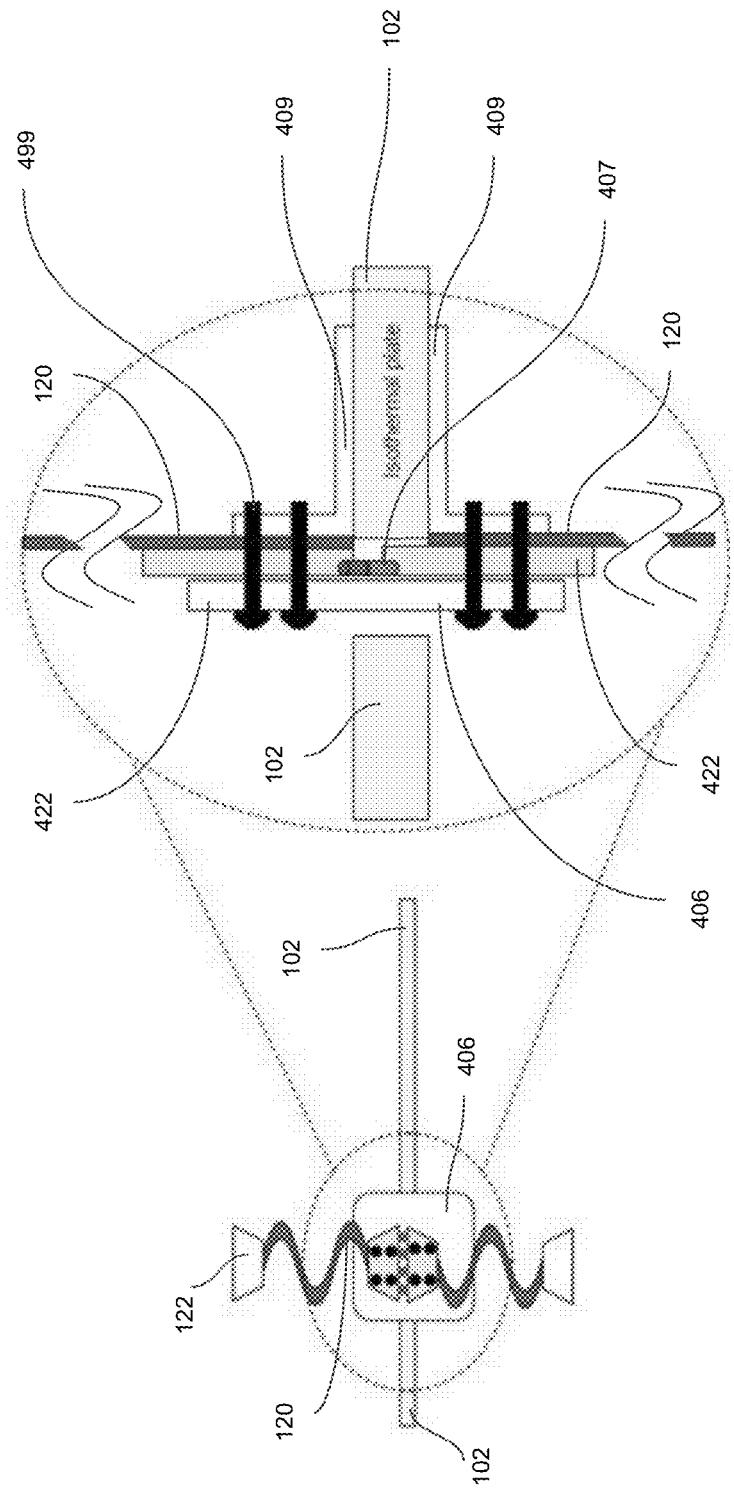

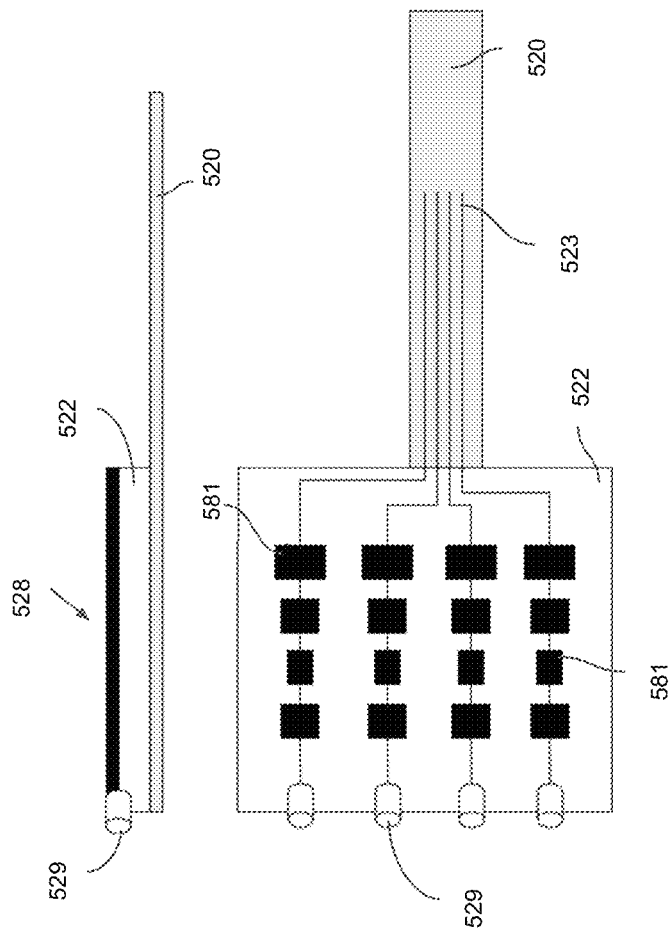

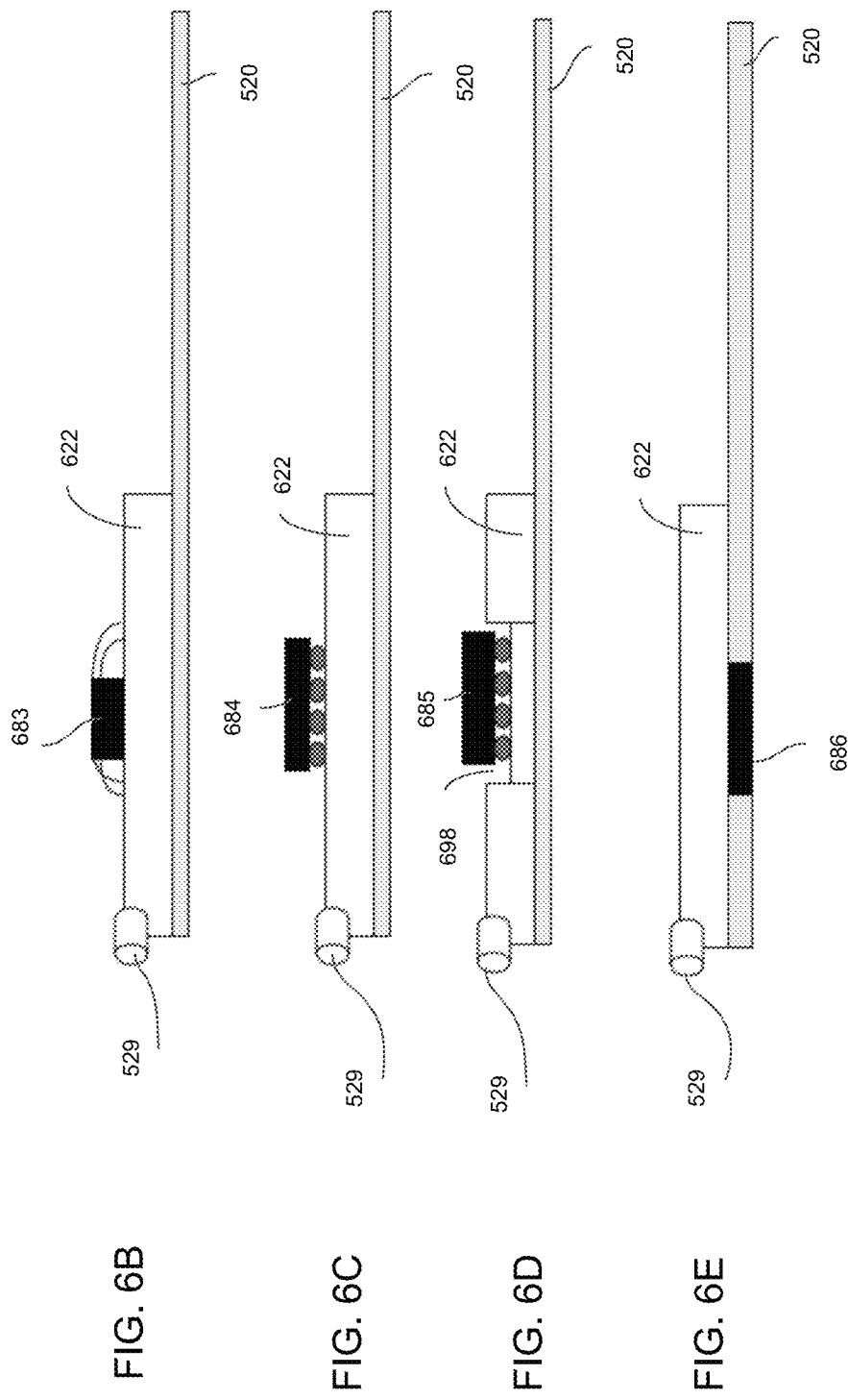

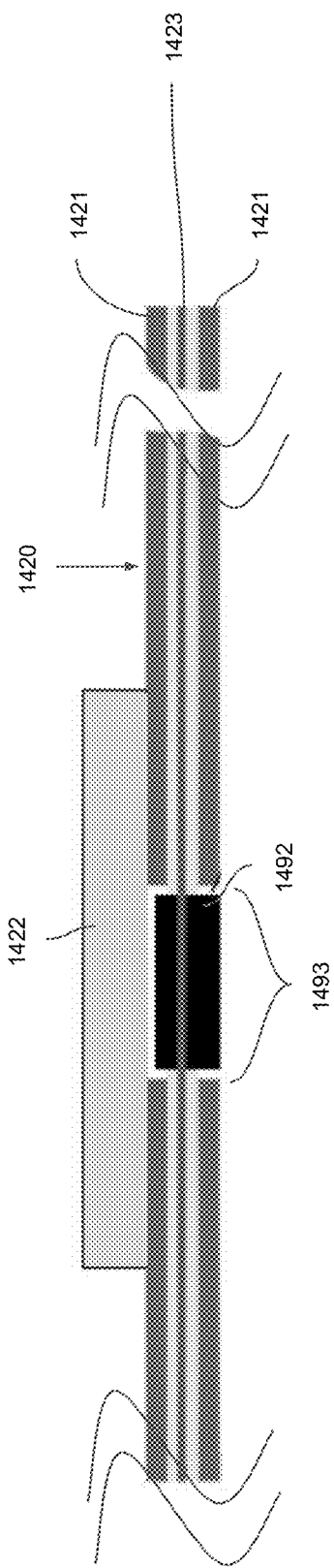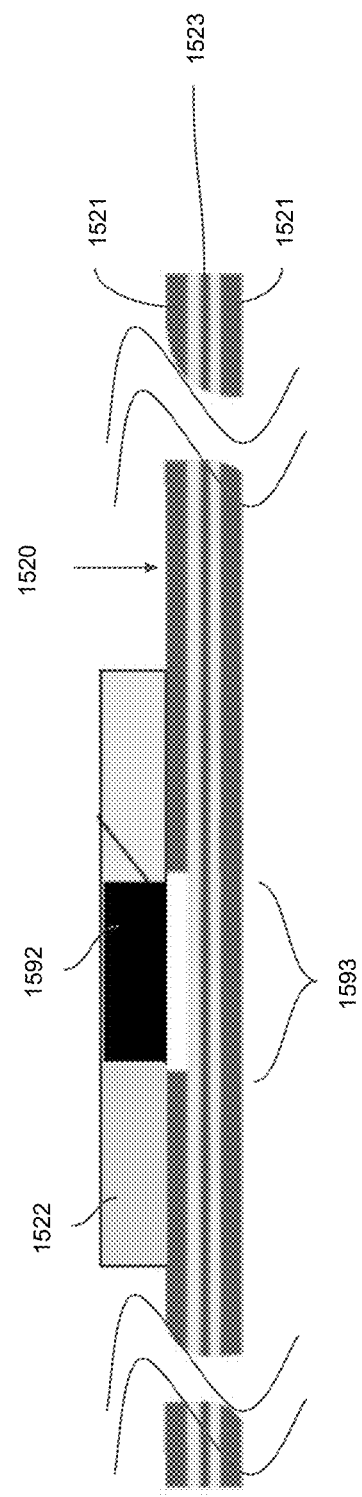

CONNECTING ELECTRICAL CIRCUITRY IN A QUANTUM COMPUTING SYSTEM

CROSS-REFERENCE TO RELATED APPLICATIONS

This application is a continuation of U.S. patent application Ser. No. 16/903,609, filed Jun. 17, 2020, entitled "Connecting Electrical Circuitry in a Quantum Computing System", which is a continuation of U.S. patent application Ser. No. 15/981,731, filed May 16, 2018, entitled "Connecting Electrical Circuitry in a Quantum Computing System", now U.S. Pat. No. 10,734,696, which claims priority to U.S. Provisional Applications Nos. 62/506,881, 62/594,928, and 62/634,647 all entitled "Connecting Electrical Circuitry in a Quantum Computing System" and filed May 16, 2017, Dec. 5, 2017 and Feb. 23, 2018, respectively. The disclosures of the above-referenced priority applications are hereby incorporated by reference in their entirety.

BACKGROUND

The following description relates to connecting electrical circuitry in a quantum computing system.

Quantum computing is an emerging and fast-growing field that aims to harness quantum effects to perform information processing. An architecture that is being explored by industry and academia is based on superconducting structures that use the macroscopic quantum behavior of a Josephson junction. Quantum computing systems often include many components, which may be connected, for example, by wire bonds, vias, PCB launch connectors, flange and panel connectors, coaxial cables assemblies, filters, attenuators, and/or hermetic feedthroughs.

BRIEF DESCRIPTION OF THE DRAWINGS

FIGS. 3 and 4 show an example flex cable connection assembly. FIG. 3 is a front cut-away view; FIG. 4 is a side cut-away view.

FIGS. 5A and 5B show an example rigid board connected to an example flex cable. FIG. 5A shows a side view; FIG. 5B shows a schematic plan view.

FIGS. 6B-6E show example connections between a rigid board and an electronic device. FIG. 6B shows an example wire-bonding connection; FIG. 6C shows an example flip-chip assembly connection; FIG. 6D shows an example cavity flip-chip connection; FIG. 6E shows an example local flex cable modification connection.

FIG. 7B shows an example with a single stripline layer; FIG. 7C shows an example with multiple stripline layers.

FIG. 10 is a front cut-away view; FIG. 11 is a side cut-away view.

FIG. 12 is a front cut-away view; FIG. 13 is a side cut-away view.

FIG. 14 shows an example of a filter integrated into a flex cable.

FIG. 15 shows an example of a filter integrated into a rigid board.

DETAILED DESCRIPTION

Figure 1:
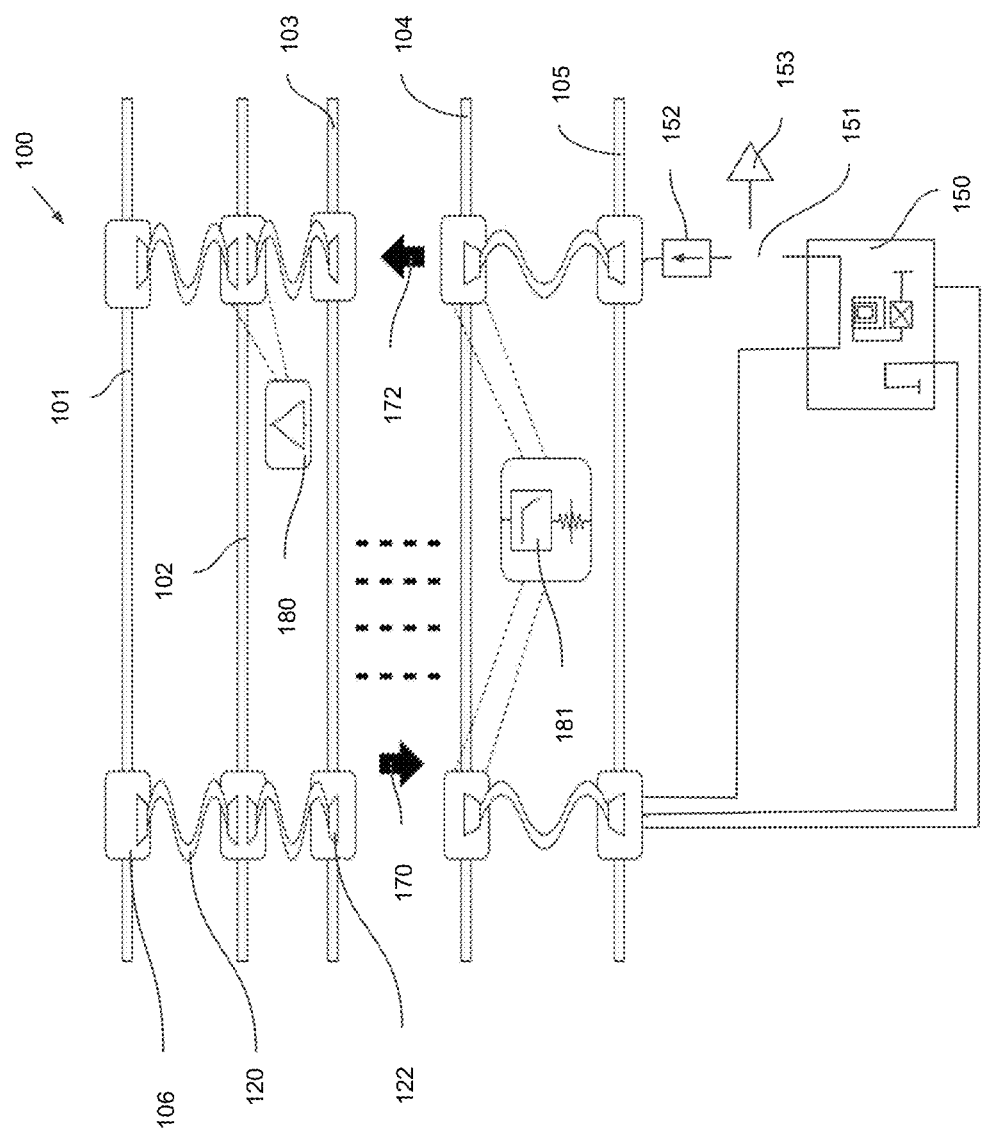
FIG. 1 shows an example quantum computer system.

In some aspects of what is described here, a flex cable includes multiple signal lines running in parallel and is connected to rigid boards at one or both ends. The signal lines may be implemented, for example, as striplines, microstrips or coplanar waveguides. In some cases, a flex cable is fanned out where it connects with the rigid board, for instance, to provide mechanical coupling between the flex cable and the rigid board at multiple spatially distributed points (e.g., with good mechanical integrity). Various components can be integrated onto the rigid board, for example, to allow greater ease of assembly and disassembly, reduction in physical space for components, reduction in thermal load on a cryogenic system, or other advantages. In some implementations, the flexible cable, rigid board or both can include composite materials; the composite material may include, for example, insulating polymer (e.g. polyimide) and conducting particulates to act as high-frequency absorbers, where high frequency is frequencies in the range of 10 GHz to 1 THz—for example, the conducting particles in some embodiments can be copper metal particles within size range of 10 microns to 100 microns diameter and density of 10 percent to 50 percent by volume.

Some aspects of the technology described here can be used to provide signal lines for large arrays of qubits in a quantum computer system. For example, the flex cable technology described here may provide a higher density of signal lines at a lower cost than some other types of hardware, in some instances. Some aspects of the technology described here may also allow for the integration of electronic components directly into flex cables, which may be useful in systems that include large qubit arrays. Some aspects of the technology described here may be used to provide high-frequency interconnects in other types of systems. For instance, flex cable technology can be used in SIS (Superconductor-Insulator-Superconductor) cryogenic receivers, high frequency board-to-board interconnects (datacenters, high-performance computing), and other types of electrical devices and systems that use high-frequency interconnects to route and drive electrical signals from one port to another within the system, or to interface different systems.

In some example quantum computing systems, electromagnetic signals (e.g., radio or microwave frequency signals) are used to control and read qubit devices or other types of system components. These signals can be routed from control and measurement instruments through a set of interconnects that link stages of a cryogenic payload (including both DC and microwave components). The payload may include, for example, circulators, isolators, high-frequency filters, DC filters, amplifiers (solid-state low-noise amplifiers and/or Josephson Parametric Amplifiers), etc. The number of I/Os in quantum computers (proportional to the first order to the number of qubits in the quantum computer) is expected to grow significantly, for instance, some expect that it will scale exponentially year after year, in analogy to Moore's law.

In some cases, the flex cable technology described here can be used to address challenges introduced by the growth in the number of I/Os in a quantum computing system. From a cryogenic point of view, a greater number of I/Os may translate to an increase in the thermal load of the system, which can make it more difficult and time-consuming to bring the cryostat down to operating temperature. In some systems, a dilution fridge is used to bring the system to milliKelvin-scale temperatures; and the fixed inner volume of a typical dilution fridge sets an upper limit to the amount of cryogenic payload that can be accommodated inside the fridge. From an assembly point of view, the time associated with initial assembly of the connectors in a cryostat may increase significantly as the number of I/Os increases. Furthermore, a high density of connectors can make it difficult or even impossible to replace a single I/O without disassembling neighboring connectors. In some cases, these challenges can be addressed, for example, using interconnects that provide a lower thermal load, can be easily assembled and disassembled, are compact in size, or have a combination of these and other attributes.

In some aspects, a flexible cable may comprise: a flexible strip with first and second parallel surfaces and first and second ends, said flexible strip being electrically insulating; a metal stripline within said flexible strip; first and second metallic grounding planes on said first and second surfaces, respectively; and a first circuit board mechanically attached to at least one of said first end of said flexible strip and said first and second metallic grounding planes at said first end, said first circuit board being mechanically stiff, said metal stripline being electrically connected to electrical circuitry on said first circuit board.

In some aspects, a cryogenic system may comprise: a plurality of isothermal plates; and at least one flexible cable as described herein; wherein said first circuit board is mechanically and thermally connected to one of said plurality of isothermal plates.

In some aspects, a cryogenic system may comprise: a plurality of isothermal plates; at least one flexible cable; and a first rigid board comprising a region of electromagnetically absorptive material; wherein said first circuit board is mechanically and thermally connected to an ambient temperature isothermal plate, and said second circuit board is mechanically attached to a quantum processing unit; wherein a first window is created in said first metallic grounding plane; wherein said flexible cable and said rigid board are clamped to a mixing plate, said rigid board being in good thermal contact with said mixing plate; and wherein said region of absorptive material is immediately adjacent to and facing said first window.

In some aspects, a flexible cable may comprise: a flexible strip with first and second parallel surfaces and first and second ends, said flexible strip being electrically insulating; a metal stripline within said flexible strip; first and second metallic grounding planes on said first and second surfaces, respectively; and a mechanical stiffener attached to at least one of said first end of said flexible strip and said first and second metallic grounding planes at said first end.

In some aspects, a flexible cable system may comprise: a first flexible cable as described in any claim, wherein the first flexible cable comprises one or more of stripline and grounding plane being formed of non-superconducting metal; a second flexible cable as described in any claim, wherein the second flexible cable comprises one or more of stripline and grounding plane being formed of superconducting metal; and an electrical connector providing electrical connection of the first and second flexible cables.

In some aspects, a cryogenic system may comprise: a plurality of isothermal plates; at least one flexible cable of claim or one flexible cable system as described herein; a quantum processing unit electrically connected to said at least one flexible cable, said quantum processing unit comprising superconducting circuits, wherein said cryogenic system is configured for said flexible cable to carry one or more signals to said quantum processing unit; and an electrical connector providing electrical connection of the at least one flexible cable and said quantum processing unit.

FIG. 1 shows a schematic of an example of a cryogenic system 100 used in a quantum computer system. The cryogenic system 100 shown in FIG. 1 includes a dilution refrigerator assembly and quantum processor unit circuitry. The example dilution refrigerator assembly shown in FIG. 1 includes a set of isothermal plates 101, 102, 103 and 104 with temperatures ranging from the ambient temperature, $T_{ambient}$, to the coldest temperature, $T_{mix}$. The example dilution refrigerator assembly also includes clamping plates 106, flex cables 120, rigid boards 122 and various electronic components. The electronic components may include, for example, low-noise amplifiers 180, filters and attenuators 181, etc.; at least some of the electronic components in the dilution refrigerator assembly can be located on the rigid boards 122. A dilution refrigerator assembly in a quantum computer system may include additional or different features, and the components may be arranged as shown or in another manner.

The example quantum computing system shown in FIG. 1 includes an interconnect system that has alternating flexible stripline cables 120 and rigid boards 120 (or backing materials, to provide rigidity) assembled together using a conductor interface (for example, BGA array, solder, indium gasket, or sandwiched using thermal compression bonding). The flexible striplines can carry multiple signals (e.g., via multiple parallel, shielded striplines) for different components of the payload, which may include, for example, planar filters (CPW, strip-line or micro-strip) 181, signal attenuators (which may be flip-chip assembled or wire-bonded to the rigid board) 181, chip circulators 151 and isolators 152, parametric amplifiers 153, low noise amplifiers 180, the quantum processor unit 150, which in embodiments may comprise a superconducting circuit, and other components.

For thermal management considerations, the rigid boards 122 can be thermally anchored to an isothermal plate 101, 102, 103, 104 of the cryostat. Furthermore, to provide good mechanical integrity of the cables 120, the flexible stripline cables 120 can be fanned out at their ends where mechanical attachment is made to the rigid boards 122. This provides for mechanical anchoring of the flex cable 120 to the rigid board 122 over a larger area, for example, with a uniformly distributed set of mechanical attachment points.

In the example shown in FIG. 1, at least some of the interconnect system that transfers signals to and from the quantum processor unit circuitry is integrated into the dilution refrigerator assembly, which may generally include a set of N isothermal plates (where N>2) with temperatures ranging from $T_{ambient}$ to $T_{mix}$, where the plate number N is designated as the "mixing plate" (105 in the example of FIG. 1). Each isothermal plate may have an opening through which flex cables 120 can pass and be anchored if desired. The flex cables 120 provide for DC, low frequency and/or high frequency electrical connection through the isothermal plates to the quantum processor unit 150 and various other electrical components. One set of flex cables may carry signals for excitation of qubits in the quantum processor unit—this is the excitation path 170—and a second set of flex cables may carry signals from the quantum processor unit 150 out of the cryostat—this is the readout path 172. In the example shown in FIG. 1, each flex cable 120 overlaps with a rigid board 122 on each end. Electrical functions can be integrated directly on the rigid portion of the cable. In some implementations, an auxiliary rigid board is thermally anchored to the isothermal plate and connected to the rigid portion of the cables on each side through connectors.

Figure 2:
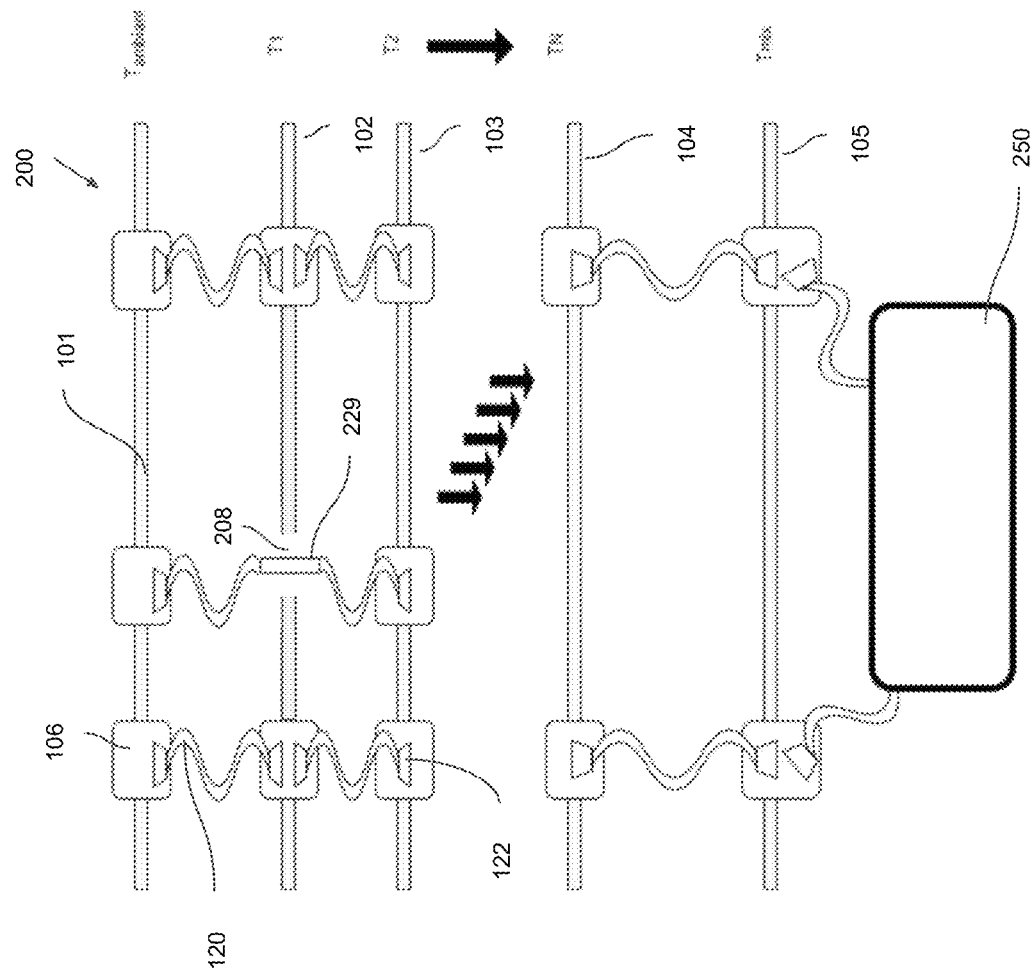
FIG. 2 shows another example quantum computer system.

FIG. 2 shows a schematic of a cryogenic system 200 including a cryogenic quantum integrated circuit system 250. As shown in FIG. 2, flexible cables 120 can bypass isothermal plates—one or more of isothermal plates 102, 103, 104 and 105. For example, a flexible cable can connect a plate (i) to another plate (i+k) where k>2 though an opening in one or more intermediate isothermal plates. In some cases, a cable can pass through an isothermal plate without thermally shorting the isothermal plates to which the cable is anchored, for example, due to a high thermal conductivity of the cable. Flex cable 229 is an example of a flexible cable that bypasses isothermal plate 103—passing through gap 208 without being thermally anchored to the plate 103.

In some cases, each flex cable 120 in the example cryogenic systems shown in FIGS. 1 and 2 can include a set of radio frequency (RF) transmission lines, DC (direct current) transmission lines, or a set of signal lines that includes both RF and DC transmission lines. The ends of each flex cable 120 may be bonded to rigid boards 122, which may host electronic active and or passive components. The rigid boards 122 may be realized using PCB technology or another type of technology. The rigid boards 122 can include one or more metallization layers and one or more dielectric layers. Each rigid board 122 can overlap with a fanout area of a flex cable 120 and host active and passive electronic components. The components can be discrete or integrated, surface mount or embedded into the rigid board, for example.

The example flex cables 120 may provide improvements in the assembly and operation of the cryogenic systems, in some cases. For instance, an individual flex cable 120 in FIG. 1 or 2 may include multiple parallel signal lines, which can provide an improvement over coaxial cables that have a single transmission line per cable. In some instances, the flex cables 120 in FIGS. 1 and 2 provide a more scalable thermal conductivity profile than coaxial cables. For example, reducing the thermal conductivity of a coax cable (often dominated by the conductor cross-section) may increase signal loss in the cable due to increased impedance. In addition, the flex cables 120 in FIGS. 1 and 2 can include a fanout area of transmission lines and integration of the flex cable with a rigid PCB 122 at either end of the flex. The fanout configuration and integration can improve mechanical integrity, increase the number of times the flex cable can be connected and disconnected, improve impedance matching, allow a broader range of connectors, or provide a combination of these and other advantages.

In the examples shown in FIGS. 1 and 2, flexible cables 120 can be thermally connected to an intermediate isothermal plate using a thermally conductive fixture. In some instances, a flex cable 120 can be directly connected to the housing of a quantum processor unit 150, 250 (positioned below the mixing plate 105 in FIGS. 1 and 2).

FIGS. 3 and 4 show an example flex cable connection assembly clamped to an intermediate isothermal plate. FIG. 3 is a cut-away front view; FIG. 4 is a cut-away side view. Two flex cables 120 are electrically connected by an electrical connection 407 between rigid boards 422. The rigid boards 422 are clamped between clamping plates 406 and 409 which also act to thermally connect the rigid boards 422 to the isothermal plate 102. Screws 499 are used to effect the clamping of the rigid boards 422 between clamping plates 409 and 406. Screws 499 and clamping plates 406 and 409 are all fabricated from coefficient of thermal expansion (CTE) matched materials, for example these components may all be made of aluminum or copper. Isothermal plates, such as isothermal plate 102, are typically made of high thermal conductivity materials such as brass or copper.

FIGS. 5A and 5B show an example rigid board 522 connected to an example flex cable 120. FIG. 5A shows a side view; FIG. 5B shows a schematic plan view. The example assembly shown in FIGS. 5A and 5B is an example of integration of planar microstrip filters 581 on the rigid board 522. The planar microstrip filters 581 and electrically conductive lines form a top layer on the rigid board top surface 528. The planar filters 581 may be attached to the rigid board 522, for example, as shown in FIGS. 6B, 6C, or 6D, or in another manner. The planar microstrip filters 581 are electrically connected to striplines 523 in the flex cable 520 at one end and to electrical connectors 529 at the other end.

Figure 6A:
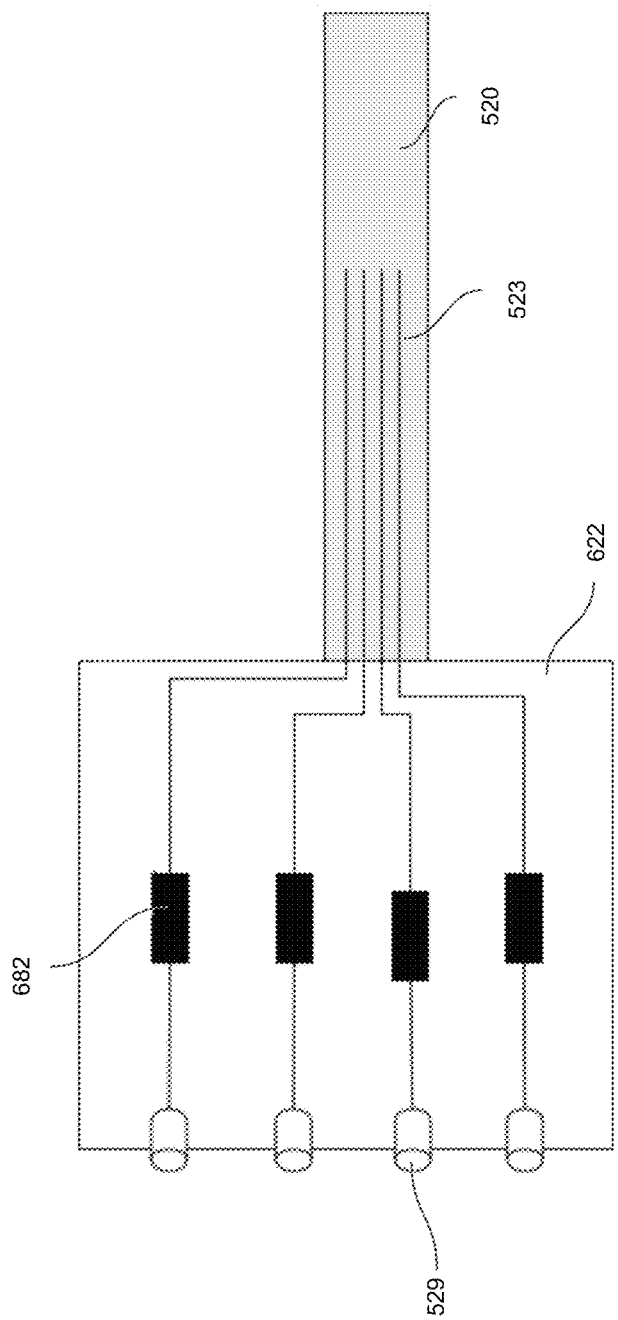
FIG. 6A shows a schematic plan view of another example rigid board, with electronic devices mounted thereon, connected to an example flex cable.

FIG. 6A shows a schematic plan view of another embodiment of a rigid board 622 connected to a flex cable 520, with electronic devices 682 attached to the board and electrically connected to striplines 523 at one end and electrical connectors 529 at the other end. FIGS. 6B-6E show example connections between the rigid board 622 and an electronic device. FIG. 6B shows an example of a wire-bonded device 683; FIG. 6C shows an example of a flip-chip connected device 684; FIG. 6D shows an example of a cavity flip-chip connected device 685; FIG. 6E shows an example of a device 686 formed by a localized flex cable material modification. The example shown in FIG. 6E may include an area of, or "window" in, the flex cable comprising a polymer with a different electric and magnetic loss tangent and permeability. For instance, one or more performance characteristics of a quantum processor unit (QPU) may rely heavily on the suppression of thermal noise at the input of a qubit devices in a superconducting circuit. Such noise mitigation may be achieved using resistive devices in the form of broadband dissipative filters or attenuators. By locally changing the electrical properties of the substrate (for example by increasing the dielectric and magnetic loss tangents), this noise can be substantially reduced. In practice, 40-60 dB is a typical desired attenuation outside of the band of operation of a qubit in a superconducting circuit device. In this context, the flex cable polymer can be loaded with conductive or non-conductive particles (iron, copper, silicon carbide) to increase the attenuation. For example, the particles in some embodiments can be within a size range of 10 microns to 100 microns in diameter and with a density of 10 percent to 50 percent by volume, and a desirable frequency range for attenuation can be 10 GHz to 1 THz.

Figure 7A:
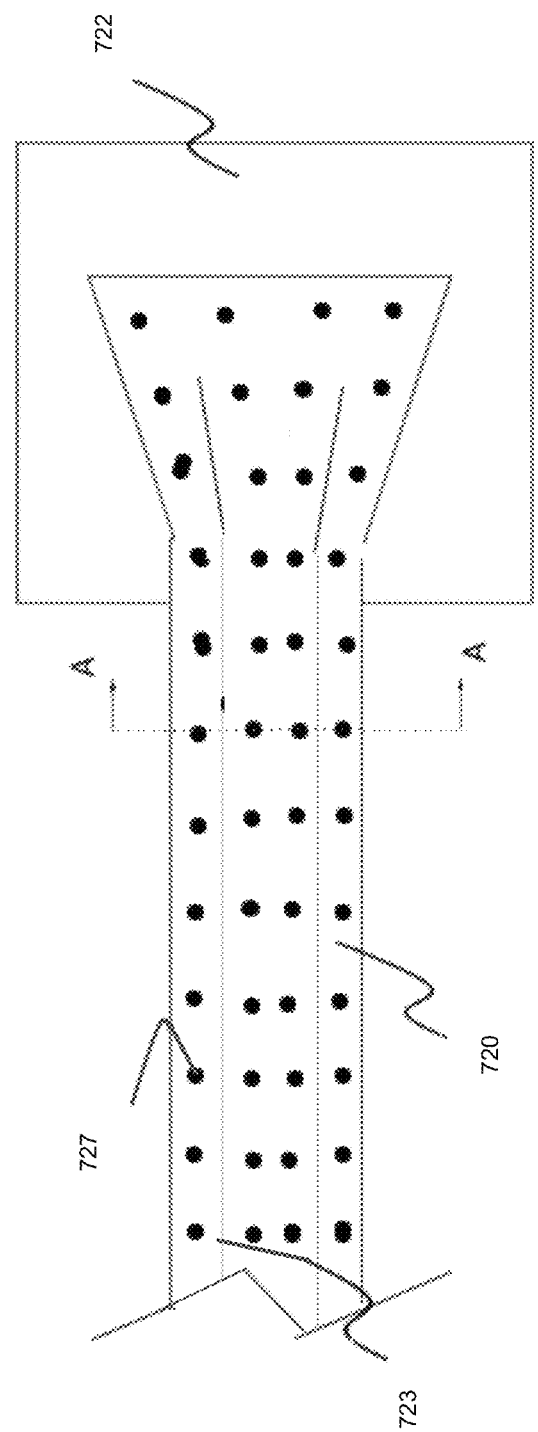
FIG. 7A shows a top view of an end of an example flex cable connected to an example rigid board.
Figure 7B:
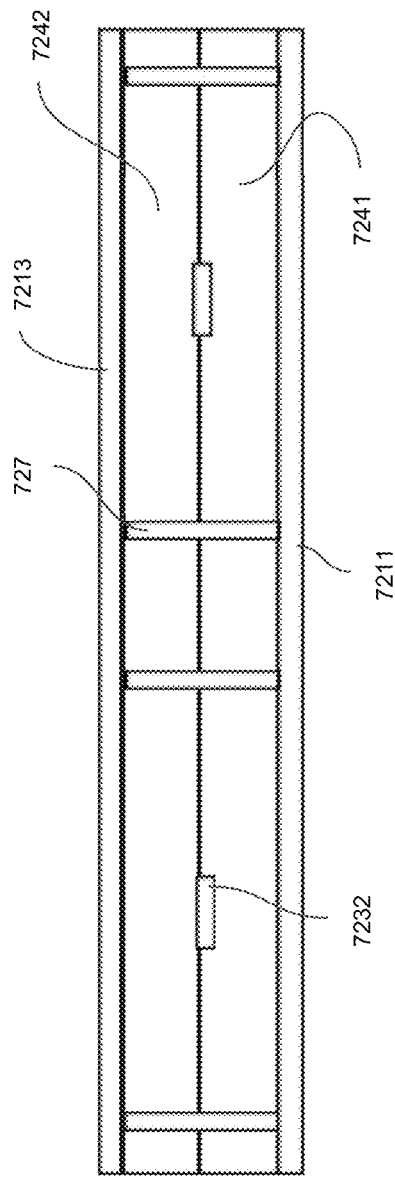
FIGS. 7B, 7C show two example implementations of cross section A-A in the example flex cable shown in FIG. 7A.
Figure 7C:
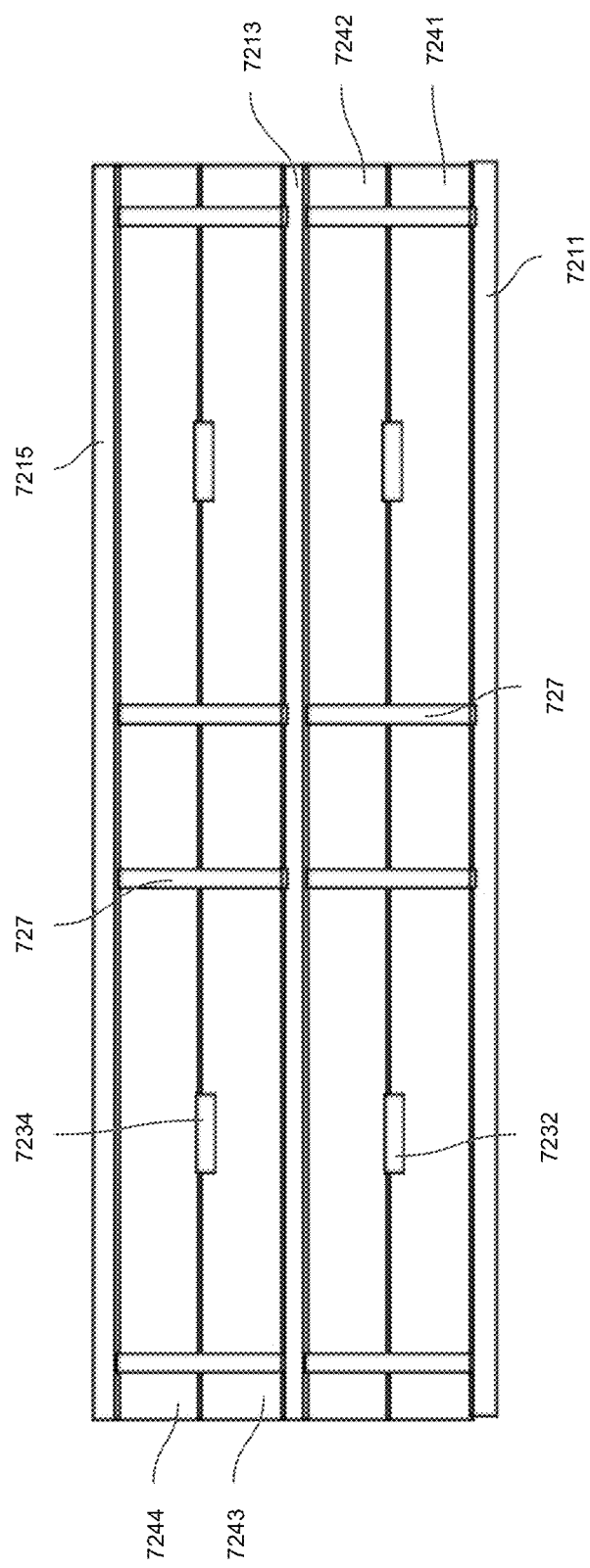

FIG. 7A shows a top view of one end of an example flex cable 720 connected to an example rigid board 722. FIGS. 7B and 7C show cross sections A-A for two example implementations of the example flex cable shown in FIG. 7A. FIG. 7B shows an example with a single stripline layer; FIG. 7C shows an example with multiple stripline layers.

In the examples shown in FIGS. 7A, 7B, 7C, the rigid board 722 can be, or can include, a PCB board made of at least one electrical conductor later and one insulator layer. The rigid board 722 may include via holes, thermally conductive vias and fixturing holes for thermal grounding to the isothermal plates. In the examples shown in FIGS. 7A, 7B and 7C, the flex cable 720 can be made of at least three conductor layers and two insulating layers and comprise striplines 723 and electrically conductive vias 727 for electromagnetic shielding of the striplines. In some examples, a flex cable stack-up can include the following layers (shown, for example, in FIG. 7B):

A first electrical conductor layer 7211 can be a ground plane made of copper of thickness ranging from 1 micron to 5 microns.

A second electrical conductor layer 7232 can be composed of "stripline" transmission lines made of metal, superconducting or non-superconducting, and made of for example copper, of thickness ranging from 1 micron to 5 microns.

A third electrical conductor layer 7213 can be a ground plane made of copper of the same thickness as the first conductor layer and comprising an opening for signal routing.

Between layers 7211 and 7232 there is a first dielectric layer 7241 made of a flexible material, typically polyimide (such as the polyimide material commercially known as Kapton). The thickness of the polyimide layer in some embodiments is roughly 5 mils.

Between layers 7232 and 7213 there is a second dielectric layer 7242 made of the same material as the first dielectric layer or another flexible material.

Ground planes 7211 and 7213 may be connected by electrically conductive vias 727.

FIG. 7C shows an example of a flex cable with more layers, specifically:

A fourth electrical conductor layer 7234 can be composed of "stripline" transmission lines made of metal, superconducting or non-superconducting, and made of for example copper, of thickness ranging from 1 micron to 5 microns.

A fifth electrical conductor layer 7215 can be a ground plane made of copper of the same thickness as the first conductor layer and comprising an opening for signal routing.

Between layers 7213 and 7234 there is a third dielectric layer 7243 made of a flexible material, typically polyimide (such as the polyimide material commercially known as Kapton). The thickness of the polyimide layer in some embodiments is roughly 5 mils.

Between layers 7234 and 7215 there is a fourth dielectric layer 7244 made of the same material as the third dielectric layer or another flexible material.

Ground planes 7213 and 7215 may be connected by electrically conductive vias 727.

The properties of the flex cable can be engineered by choosing an adequate type of conductor. For example, for superconducting operation, the conductor layer may be made of Nb, TiNb, or Al. In applications for which electrical loss may be tolerated, the conductor layer may be made, for example, of Stainless Steel, Cupronickel, Brass, or Cu with a low RRR (residual resistance ratio).

Figure 8:
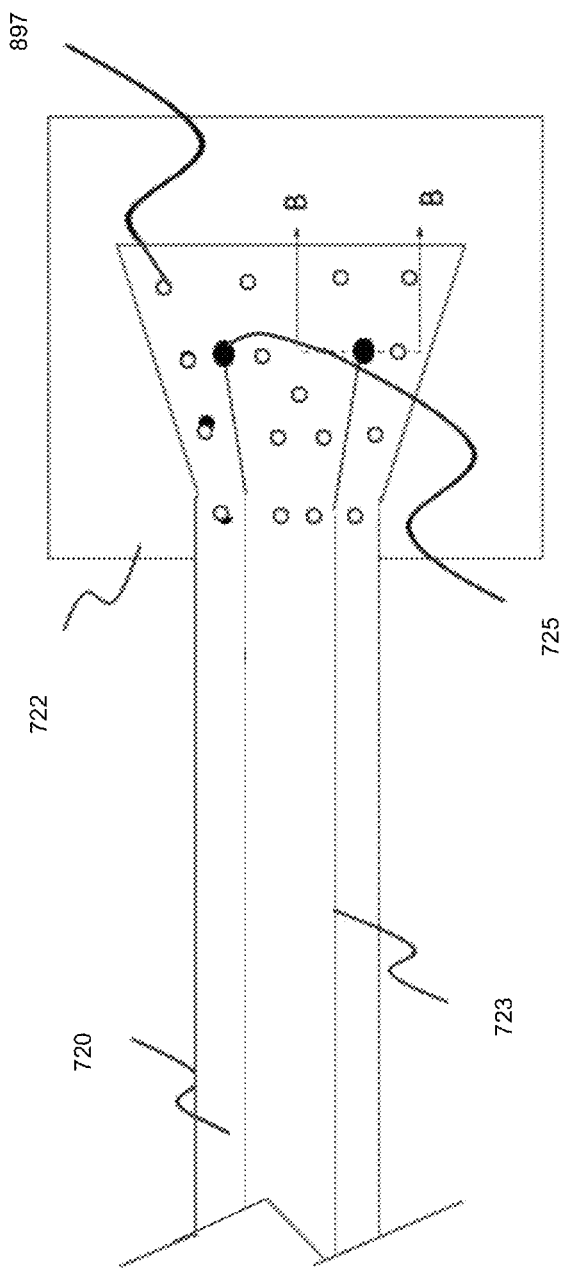
FIG. 8 shows a top view of an end of an example flex cable connected to an example rigid board.

FIG. 8 shows a top view of an end of an example flex cable 720 connected to an example rigid board 722. The example assembly shown in FIG. 8 includes bumps 897 (e.g., solder bumps) that provide mechanical and electrical connections between the flex cable 720 and the rigid board 722. The bumps 897 may be formed, for example, of indium or a similar material. In some implementations, the bumps 897 may be spaced apart, for example, with a spacing in the range of 500 microns to 1 millimeter center-to-center, and the bumps may be sized, for example, to have a diameter in the range of 50 microns to 200 microns after reflow. An arrangement of bumps 897 may be a square array, or the bumps 897 may be otherwise arranged as needed to efficiently spread the mechanical load and maintain good electrical contact between the flex cable 720 and the rigid board 722. In some embodiments, a sheet of indium or other material may be used in place of bumps, with cut-outs for central conductors that connect striplines 723 to circuits on the rigid board 722—for example, a cut out in the indium sheet around a stripline connector via 725 which serves to connect the stripline 723 to electrical circuits on the rigid board 722.

Figure 9:
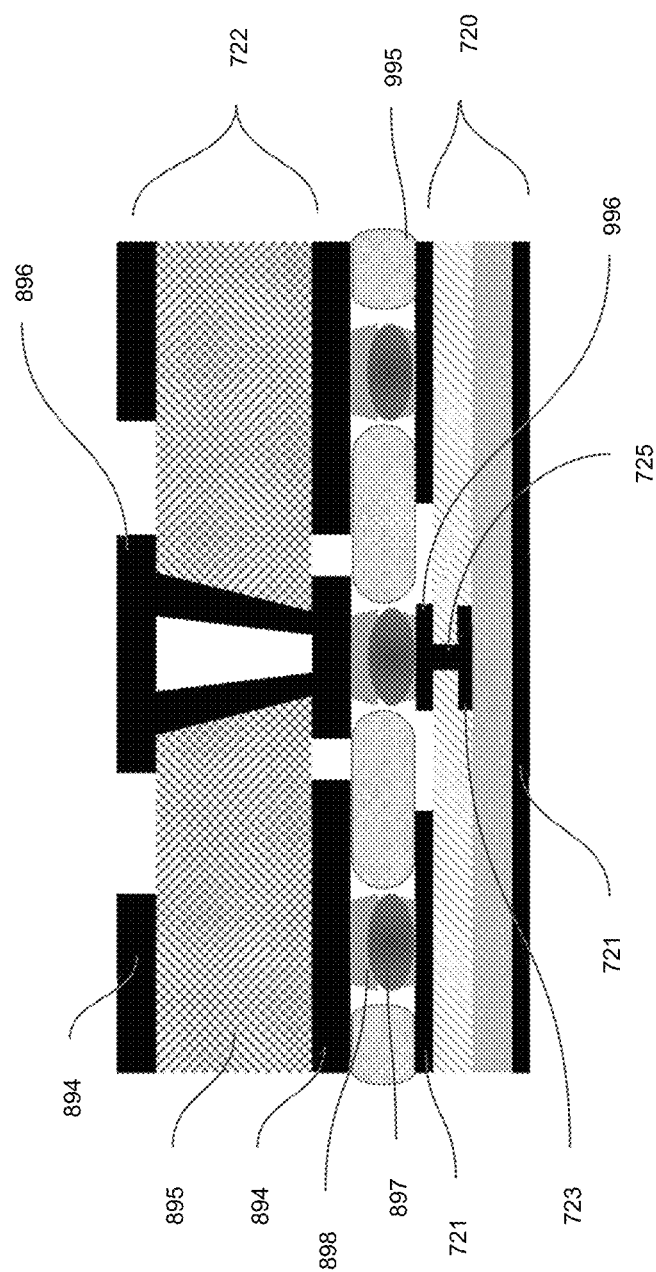
FIG. 9 shows an example implementation of cross section B-B in the example assembly shown in FIG. 8.

FIG. 9 shows cross section B-B of the example flex cable 720 and the example rigid board 722 shown in FIG. 8. The rigid board 722 is shown to comprise top and bottom metal grounding planes 894, an insulating layer 895 between top and bottom metal grounding planes, and an electrical connector 896—providing electrical connection through the rigid board from top to bottom. The electrical connector 896 is isolated from the metal grounding planes 894. The flex cable 720 has top and bottom metal grounding planes 721, a stripline 723, a circular contact button 996, and a via 725 electrically connecting the button 996 to the stripline 723. The rigid board 722 is mechanically and electrically connected to the flex cable 720 using solder bumps 897. Solder cups 898 may be fixed to the bottom metal layer of the rigid board 722 and/or the top metal layer 721 of the flex cable 720, and also at the bottom surface of electrical connector 896 on the rigid board 722 and/or the top surface of the button 996 on the flexible cable 720; the solder bumps 897 are positioned at the cups 898 as shown in FIG. 9. As shown in FIG. 9, an underfill 995 may also be used to fill the space between solder bumps 897; the underfill 995 may assist with handling the mechanical load between the flex cable 720 and the rigid board 722. The underfill may be an adhesive material such as used in edge bonding, etc. The solder bumps can be formed of materials such as indium, tin, tin-lead, etc. In some implementations, the example assembly shown in FIGS. 8 and 9 can be fabricated in a process that includes flex cable processing, rigid board processing, assembly of the flex cable and rigid board, component assembly and mount, and potentially other steps (e.g., edge-bonding or underfill). The flex cable 720 may be processed, for example, on a silicon or glass wafer. The first layer can be a release layer (a temporary process layer). The first metallization layer can be deposited on one or multiple flex substrate layers (liquid crystal polymer (LCP), polyimide such as Kapton, or others) by dry film lamination or spin coating. Via processing can be performed by laser drilling or photolithography with a hard-mask, for example. The rigid board 722 can include one or more core dielectric substrates and one or more conductor layers. The rigid board can be formed of a material comprising an organic polymer, silicon, alumina or another kind of substrate material.

FIGS. 10-17 provide examples of a filter/attenuator integrated into either a rigid board or a flex cable. These techniques may be used, for example, to allow the flex cable to run as a continuous cable from the room temperature plate all the way to the quantum processor unit (QPU) in a dilution refrigerator assembly. At the QPU, the filter/attenuator may be clamped to the mixing plate, for example, to get the filter/attenuator as close to the QPU as possible without generating heat within the mixing chamber (clamping to the mixing plate may allow the heat to be dissipated at the mixing plate). In embodiments, flex cables with integrated filter/attenuator may run between any two isothermal plates, and the filter/attenuator may be clamped to a suitable isothermal plate for removal of heat generated by the filter/attenuator into the isothermal plate. Furthermore, electronic devices may be integrated on rigid circuit boards at both or either ends of the flex cable as described above.

Figures 10, 11:
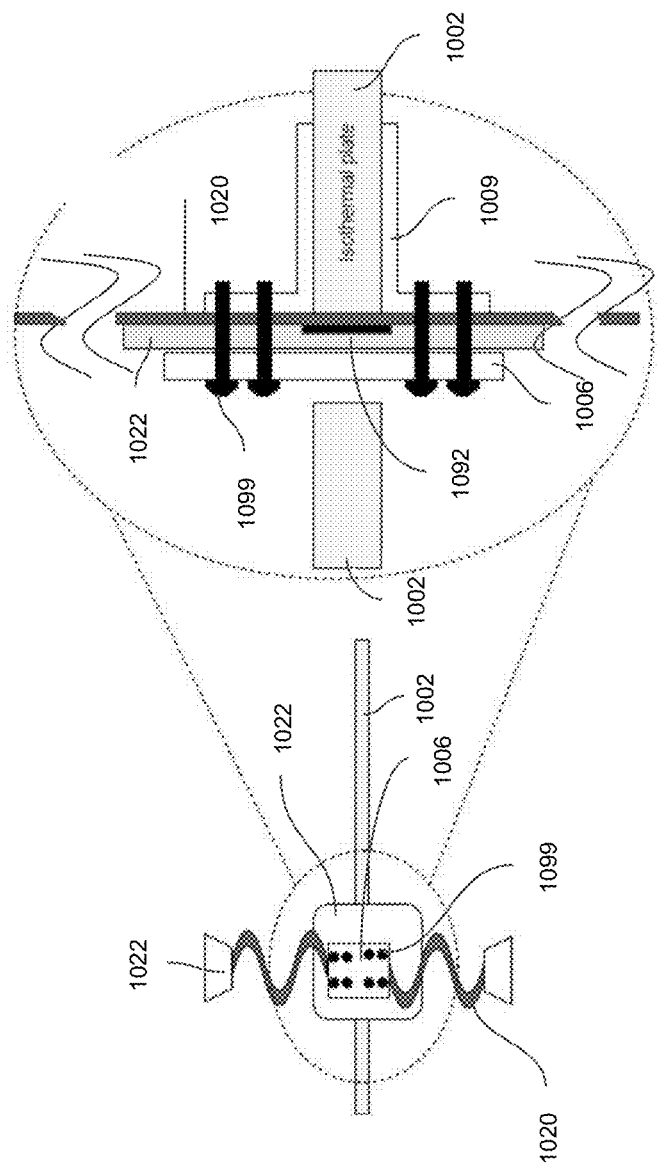
FIGS. 10 and 11 show another example flex cable connection assembly.
Figure 16:
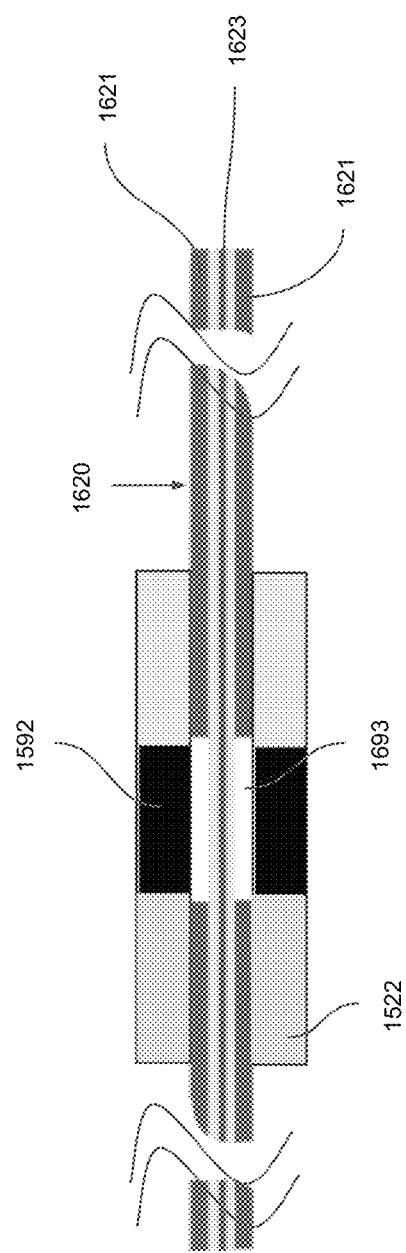
FIG. 16 shows an example of a filter integrated into rigid boards.

FIGS. 10 and 11 show an example flex cable connection assembly. FIG. 10 is a front cut-away view; FIG. 11 is a side cut-away view. FIGS. 10-11 show an example of a filter 1092 clamped to an isothermal plate 1002, the filter 1092 being configured as absorptive material integrated into a rigid board 1022 positioned over a window in the ground plane of the flex cable 1020 as shown in FIGS. 14, 15, and 16, for example. The rigid board 1022 and flex cable 1020 are clamped between clamping plates 1006 and 1009 which also act to thermally connect the rigid board 1022 and flex cable 1020 to the isothermal plate 1002. Screws 1099 are used to effect the clamping of the rigid board 1022 and flex cable 1020 between clamping plates 1009 and 1006. Screws 1099 and clamping plates 1006 and 1009 are all fabricated from coefficient of thermal expansion (CTE) matched materials, for example these components may all be made of aluminum or copper. Isothermal plates, such as isothermal plate 1002, are typically made of high thermal conductivity materials such as brass or copper.

Figures 12, 13:
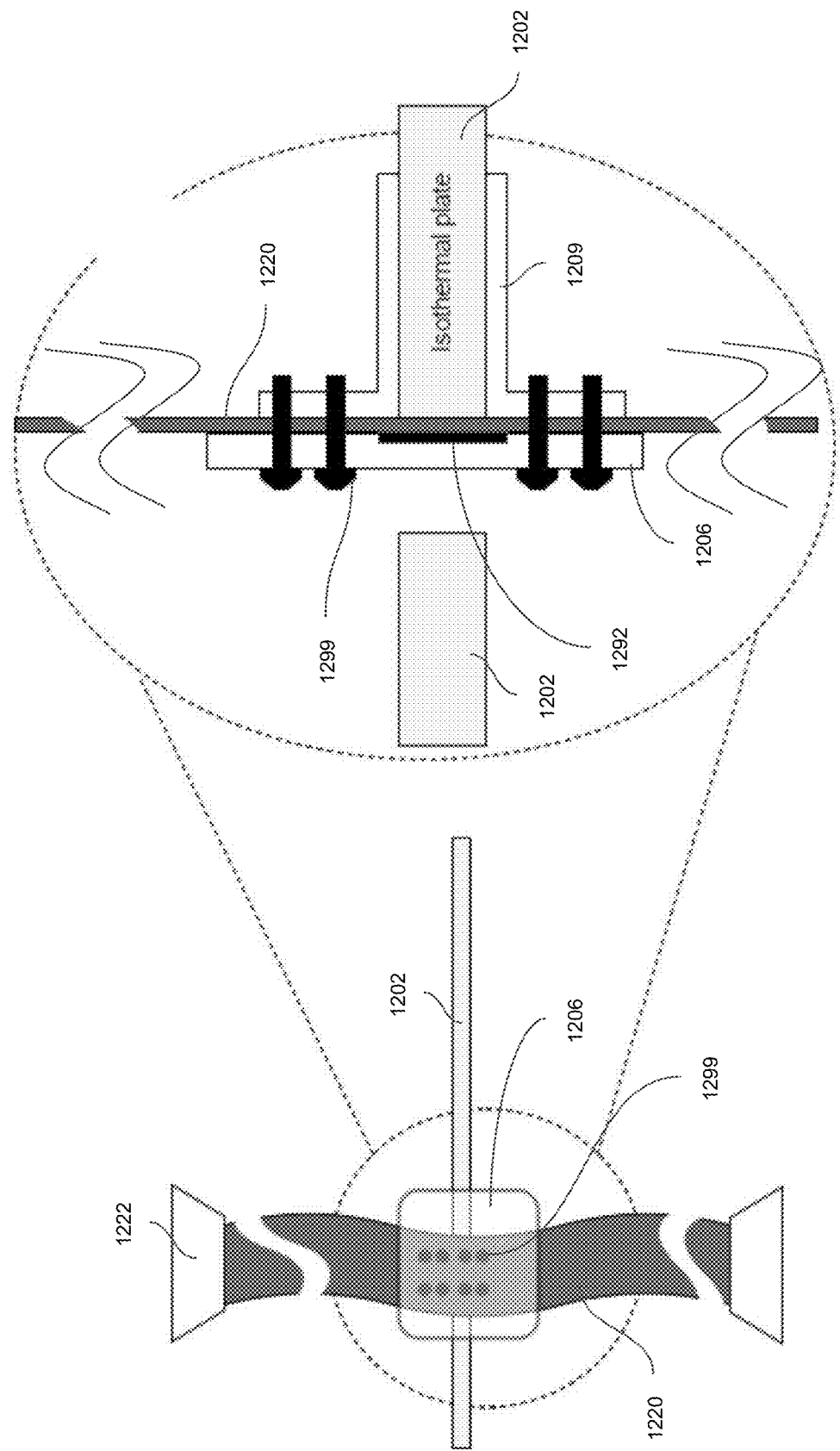
FIGS. 12 and 13 show another example flex cable connection assembly.

FIGS. 12 and 13 show another example flex cable connection assembly. FIG. 12 is a front cut-away view; FIG. 13 is a side cut-away view. FIGS. 12-13 show an example of a filter 1292 clamped to an isothermal plate 1202, the filter being configured as absorptive material integrated into a flex cable 1220 in a window in the ground plane of the flex 1220 as shown in FIGS. 14 and 15, for example. The flex cable 1220 is clamped between clamping plates 1206 and 1209 which also act to thermally connect the flex cable 1220 to the isothermal plate 1202. Screws 1299 are used to effect the clamping of the flex cable 1220 between clamping plates 1209 and 1206. Screws 1299 and clamping plates 1206 and 1209 are all fabricated from coefficient of thermal expansion (CTE) matched materials, for example these components may all be made of aluminum or copper. Isothermal plates, such as isothermal plate 1202, are typically made of high thermal conductivity materials such as brass or copper.

Figure 17:
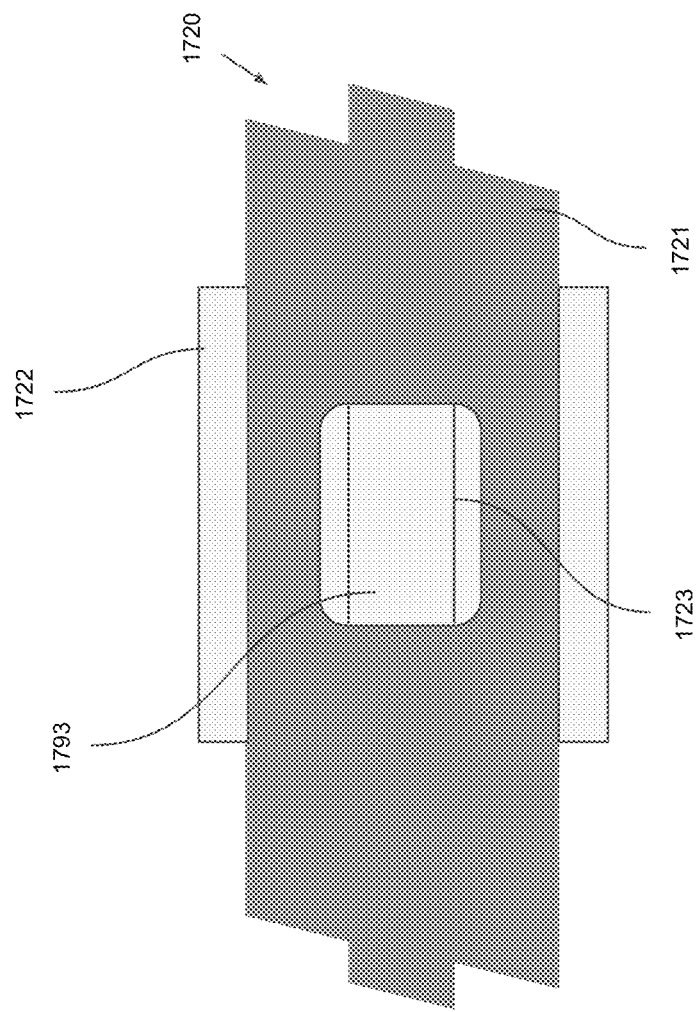
FIG. 17 shows a plan view of an example flex cable connected to an example rigid board.

FIG. 14 shows an example of a filter 1492 integrated into a flex cable 1420. The filter 1492 includes absorptive material in a window 1493 in the ground planes 1421 of the flex 1420; the window can be as shown in FIG. 17, for example. The filter 1492 is adjacent to a rigid board 1422 attached to the flex cable 1420. The flex cable 1420 also comprises a stripline 1423 which runs through the absorptive material of the filter 1492.

FIG. 15 shows an example of a filter 1592 integrated into a rigid board 1522. The filter 1592 includes absorptive material, and the rigid board 1522 and flex cable 1520 are configured so that a window 1593 in the ground plane 1521, adjacent to the rigid board 1522, of the flex cable 1520 aligns with the absorptive material in the rigid board 1522; the window can be as shown in FIG. 17, for example. The flex cable 1520 also comprises a stripline 1523 which runs adjacent to the absorptive material of the filter 1592 and underneath the window 1593.

FIG. 16 shows an example of filters 1592 integrated into two rigid boards 1522. The filter 1592 includes absorptive material, and the rigid boards 1522 and flex cable 1620 are configured so that windows 1693 in the ground planes 1621 of the flex cable 1620 align with the absorptive material in the rigid boards 1522; the windows 1693 can be as shown in FIG. 17, for example. The flex cable 1620 also comprises a stripline 1623 which runs adjacent to the absorptive material of the filters 1592 and between the windows 1693 in the ground planes 1621.

FIG. 17 shows a plan view of an example flex cable 1720 connected to an example rigid board 1722. FIG. 17 shows a window 1793 in the ground plane 1721 of the example flex cable 1720. The flex cable 1720 also comprises striplines 1723 which run through or underneath the window 1793, depending on the configuration—see FIGS. 14-16.

Figure 18:
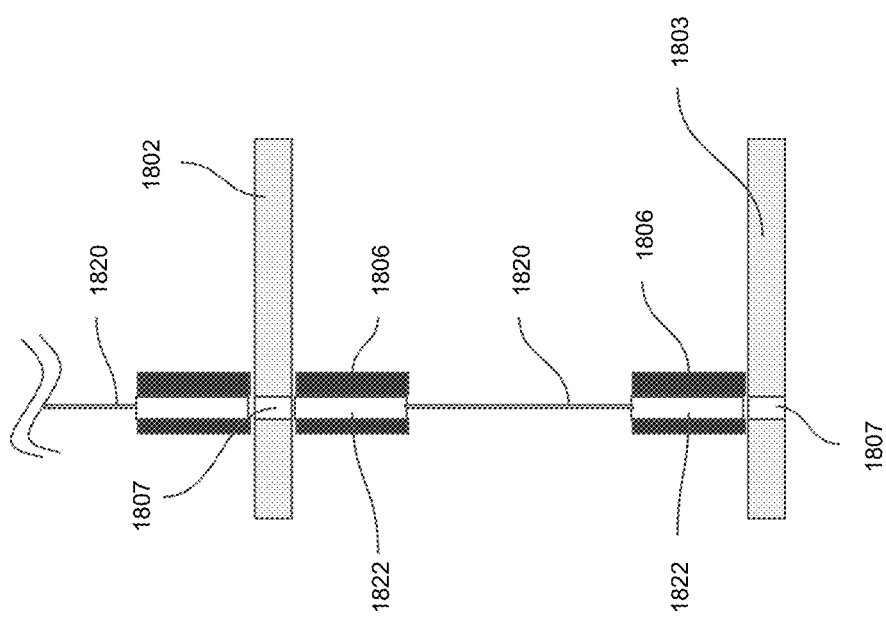
FIG. 18 shows an example of a flexible circuit terminated in rigid PCBs, with an OFHC copper enclosure surrounding the latter at either end.

FIG. 18 shows an example of a flexible circuit/cable 1820 terminated in rigid boards/PCBs 1822, with OFHC copper enclosures 1806 surrounding the PCBs 1822 at both ends of the cable 1820. The enclosure 1806 helps to isolate the traces on the rigid board structure 1822 that must be run as CPW or microstrip traces prior to terminating in a connector 1807. The enclosure 1806 also helps to thermalize the board 1822 over a large surface area and acts as a mounting point to the corresponding temperature plate 1802/1803. The connectors 1807 utilized are blind-mate push on connectors (such as GPO or SMP), allowing arrays of flex cables 1820 to be installed with a tight pitch.

Figure 19:
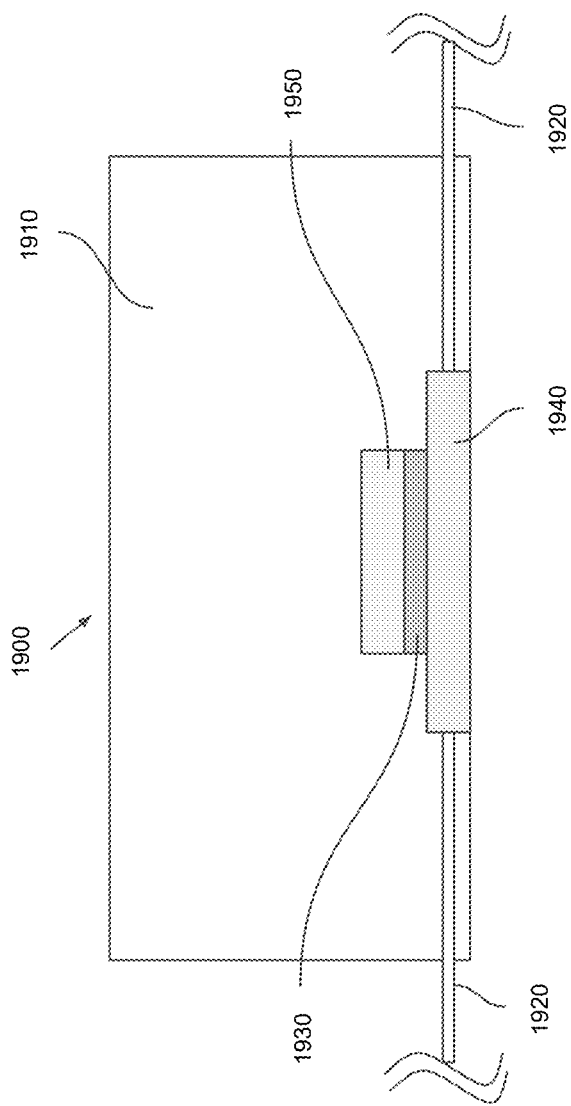
FIG. 19 shows an example of a rigid-flex cable assembly adapted for interfacing to a quantum processor unit.

FIG. 19 shows an example of a flex cable assembly 1900 adapted for interfacing to a quantum processor unit (QPU) 1950. A compliant joint 1930 passes DC and microwave signals between the QPU 1950 and rigid board/PCB 1940, yet allows for thermal contraction in the z-direction (using BeCu spring contacts, for example). Signals from the rigid board 1940 are then routed out of the flex 1920 and pass through small glands in the electromagnetic enclosure 1910 around the QPU, shielding it from low frequency magnetic and high-frequency electric fields. The remote ends of the flex 1920 are terminated with rigid boards utilizing push on connectors, as described herein, allowing the assembly to be easily swapped out.

Compliant joints provide a regular array of electrical contacts which are compliant in so far as spring structures are used to make the actual contact. These spring structures may be coils or leaf springs, for example, formed of metal alloys such as Cu alloys, BeCu. The springs may have the ends coated in W or W alloy, and the ends are typically 150 microns in diameter. The springs may be coated/plated with superconducting material, such as Sn or Al, for example.

Compliant joints are useful since they make a non-permanent electrical connection which can easily be connected/disconnected. The contact force from each spring is generally smaller than 100 g, and typically 40 g. The springs are mounted in vias in a dielectric substrate, where the via diameter is typically in the range of 1.9 mm to 100 microns, typical pitch of spring contacts is roughly 1 mm and the thickness of the dielectric is typically in the range of 1 to 7 mm. Travel (compliance) is typically in the range of 5 to 15 mils and typically 8 mils per contact. The dielectric material may comprise one of FR4, polyimide, Kapton, Peak, glass fiber composite, ceramic laminates, glass filled LCP, etc. Compliant joints are available from vendors such as Neoconix and Samtec, for example.

Figure 20:
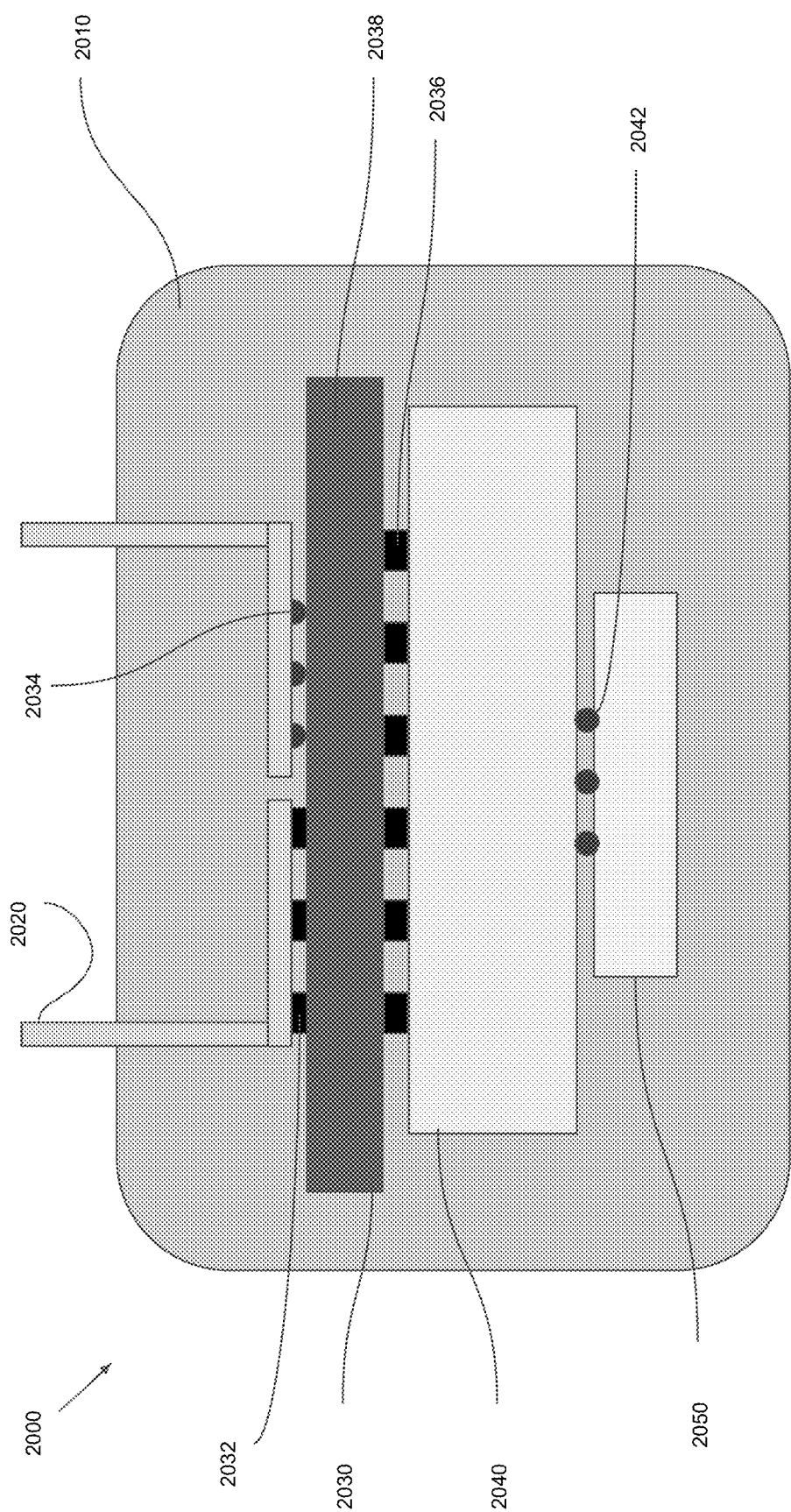
FIG. 20 shows a further example of flex cables interfacing with a quantum processor unit.

FIG. 20 shows a further example of a flex cable assembly 2000 adapted for interfacing to a QPU. A compliant joint 2030 passes DC and microwave signals between an interposer 2040 and flex cables 2020, without the use of a rigid board. A first flex cable is shown making electrical contact with the compliant joint 2030, where metal springs 2032 make contact directly to the flex cable 2020. A second flex cable is shown making electrical contact with the compliant joint 2030, where solder balls 2034 make contact directly between the flex cable 2020 and the compliant joint 2030. (In this example the compliance of the joint comes from the springs that make contact between the compliant joint 2030 and the interposer 2040.) The compliant joint 2030 has a dielectric body 2038 and springs 2032 and 2036. The quantum device substrate 2050 is shown attached to the interposer 2040 by solder balls 2042. Note that if needed a stiffener may be attached to the end portions of the flex cables 2020, where electrical contact to the compliant joint 2030 is made. Furthermore, in some embodiments the QPU enclosure 2010, which may be made of OFHC copper, for example, may be used as a stiffener—the end portions of the flex cables may be attached directly to the inner wall of the enclosure.

Figure 21:
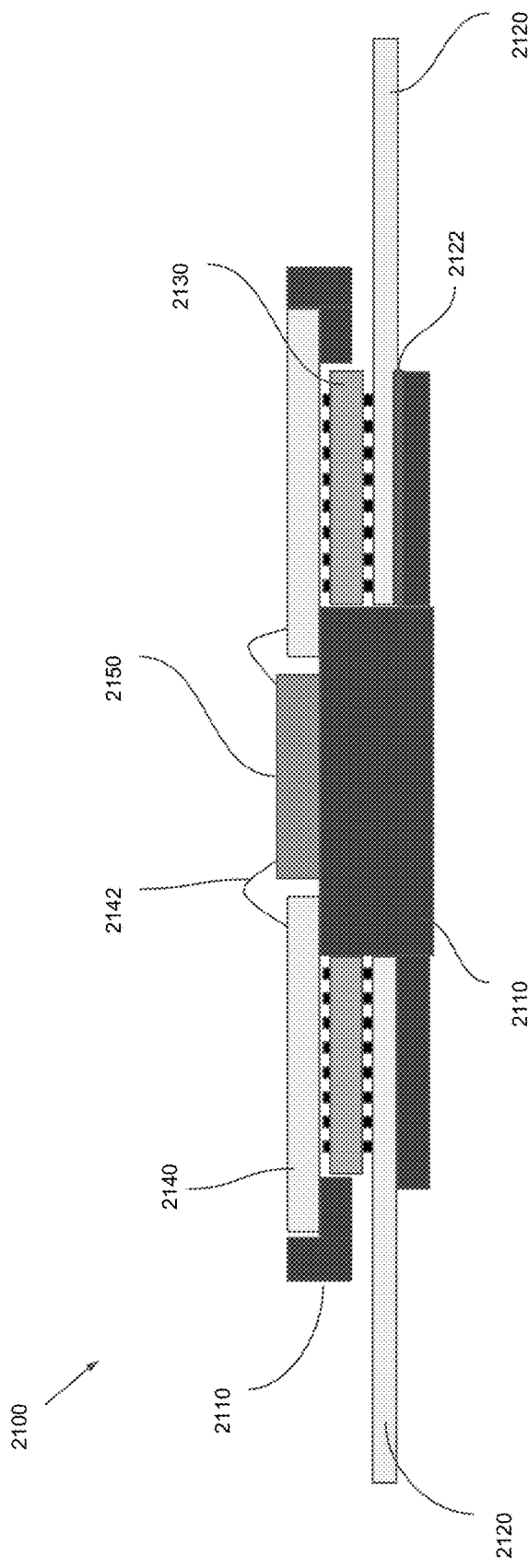
FIG. 21 shows another example of flex cables interfacing with a quantum processor unit.

FIG. 21 shows another example of a flex cable assembly 2100 adapted for interfacing to a QPU. Compliant joints 2130 pass DC and microwave signals between printed circuit boards (PCBs) 2140 and flex cables 2120. A first flex cable 2120 is shown positioned against the enclosure/stiffener structure 2110, which acts as a stiffener for the flex cable 2120 at its end portion. A second cable 2120 is shown with a rigid board 2122 between the end portion of the flex cable 2120 and the enclosure/stiffener structure. In this example, electrical contact to the quantum device 2150 is by wire bonds 2142 between the PCBs 2140 and the quantum device 2150. In further embodiments electrical contact between a flex cable and the quantum device may include a combination of the approaches outlined in FIGS. 20 and 21.

Figure 22:
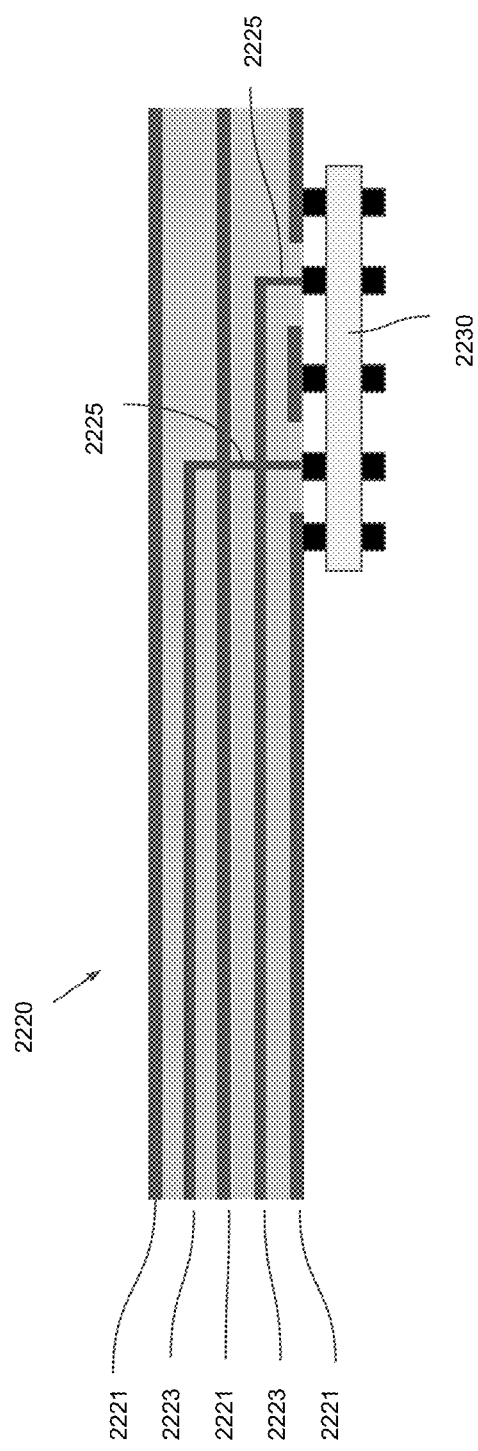
FIG. 22 shows a cross-sectional representation of a detail of a multi-layer flex cable making electrical contact with a compliant joint.

FIG. 22 shows a cross-sectional detail of a multi-layer flex cable 2220 where electrical contact is made between a compliant joint 2230 and different striplines 2223 in different layers of the flex cable 2220. Conductor-filled vias 2225 within the flex cable 2220 provide electrical connection between the striplines 2223 and the surface of the flex cable 2220, where a compliant joint 2230 can readily make electrical contact. Ground planes 2221 in the flex cable 2220 are also shown.

Figure 23:
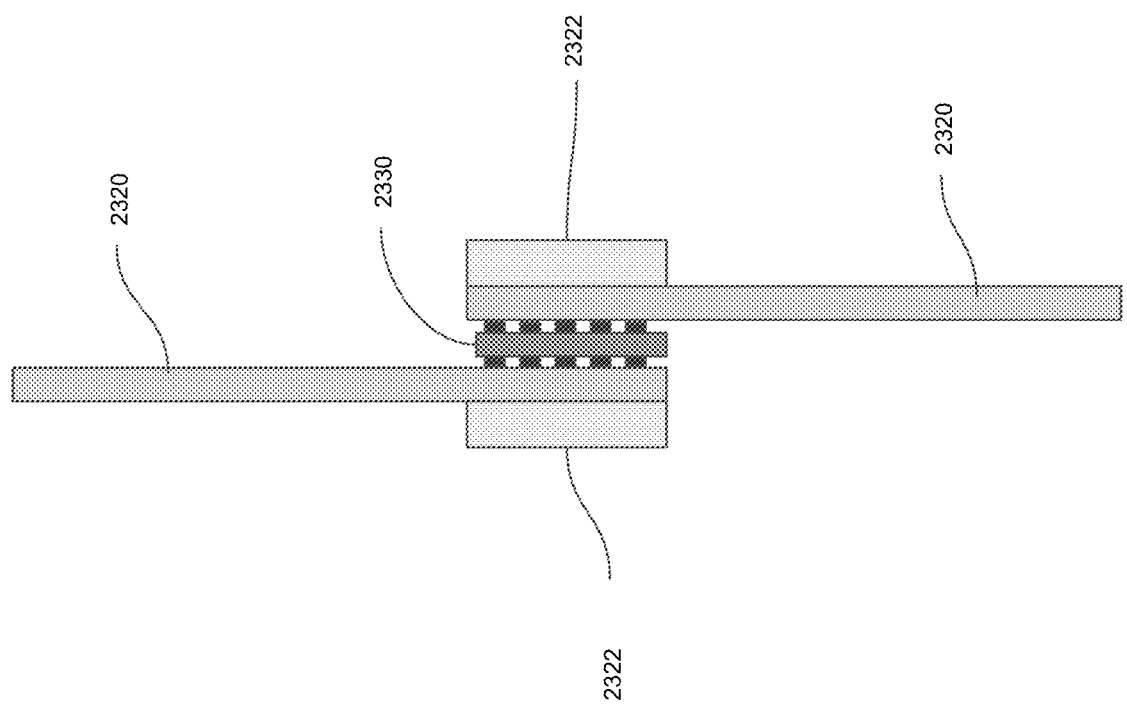
FIG. 23 shows a representation of two flex cables electrically connected using a compliant joint.

FIG. 23 shows an example of two flex cables 2320 being electrically connected using a compliant joint 2330. Connections to the striplines within the flex cables 2320 may be made as illustrated in FIG. 22, for example. To provide mechanical strength to the end portions of the flex cables 2320, where the compliant joint 2330 is used, stiffeners 2322 may be attached to the end portions of the flex cables 2320.

Stiffeners 2322 may be made of dielectric materials such as polymers (polyimides such as Kapton, Cirlex, etc.), ceramics (such as multilayer ceramics), composite materials (such as glass fiber/polymer, etc.), and metals (OHFC copper, for example). Stiffeners 2322 may be attached to the flex cable 2320 using adhesive material, or by lamination, for example. For example, a flex cable comprising polyimide and copper or aluminum ground planes can be attached to a 30 mil thick Cirlex (polyimide) stiffener by a roughly 1 mil thick layer of pressure sensitive adhesive and be cryogenically compatible; it is expected that other superconducting/non-superconducting metals, such as listed above, may be used as ground planes and also provide cryogenically compatible flex cables. Although not shown in this figure, a clamp structure such as shown in FIGS. 3, 4, and 10-13, or an enclosure such as shown in FIG. 18 can be used to ensure good electrical contact between flex cables and the compliant joint. In embodiments, a first flex cable may have normal (non-superconducting) metal striplines and/or ground planes, and a second flex cable may have superconducting metal striplines and/or ground planes, the two cables being electrically connected as shown in FIG. 23 by a compliant joint, or other electrical connectors (such as detailed above); such a configuration may be advantageous for limiting thermal conduction along a flex cable with normal metal striplines and/or ground planes through the higher temperature stages of a cryostat, and having low loss superconducting striplines and/or groundplanes through the lower temperature stages of the cryostat. Suitable metals for the striplines are listed above—for example, type 304 stainless steel striplines and/or ground planes may be used in the first flex cable and Nb or TiNb superconducting striplines and/or ground planes may be used in the second flex cable at the 4 Kelvin and lower temperature stages. Furthermore, flex cables with Al striplines and/or ground planes may be used as superconducting flex cables below the 1 Kelvin stage. It is envisaged that the flex cables run from room temperature down to the coldest stage of the cryostat may include combinations of cables, such as a stainless steel flex connected to a Nb or TiNb flex, a stainless steel flex connected to a Nb or TiNb flex connected to an Al flex, or a stainless steel flex connected to an Al flex. The stage at which the stainless steel flex cable is connected to a superconducting metal flex cable in some embodiments can be at a temperature stage at which the superconducting flex is superconducting.

Figure 24:
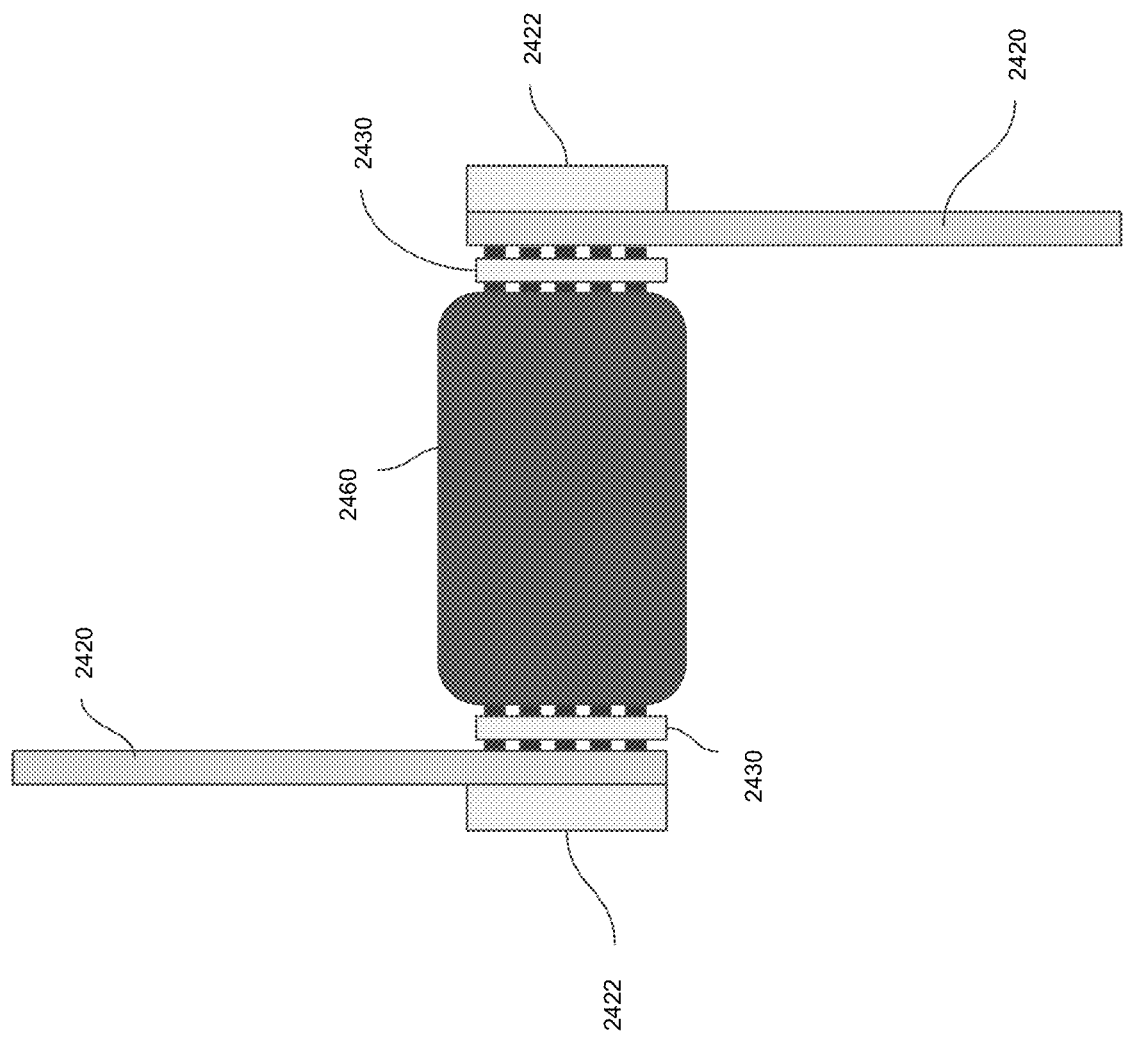
FIG. 24 shows a representation of a signal conditioning module connected to flex cables using compliant joints.

FIG. 24 shows an example of a signal conditioning module 2460 for which high frequency flex cables 2420 are used to bring the high frequency signals in and out of the module 2460 and compliant joints 2430 are used to make electrical connections between the flex cables 2420 and the module 2460. Similar to the configuration of FIG. 23, stiffeners 2422 may be attached to the flex cables 2420 at the end portions of the cables to provide mechanical integrity; furthermore, mechanical clamping may be used, as described above, to ensure good electrical contact between flex cables and the compliant joints. The module 2460 may comprise a PCB with various signal conditioning components (such as low pass and high pass filters), and a metal enclosure, such as an OFHC copper housing.

Figure 25:
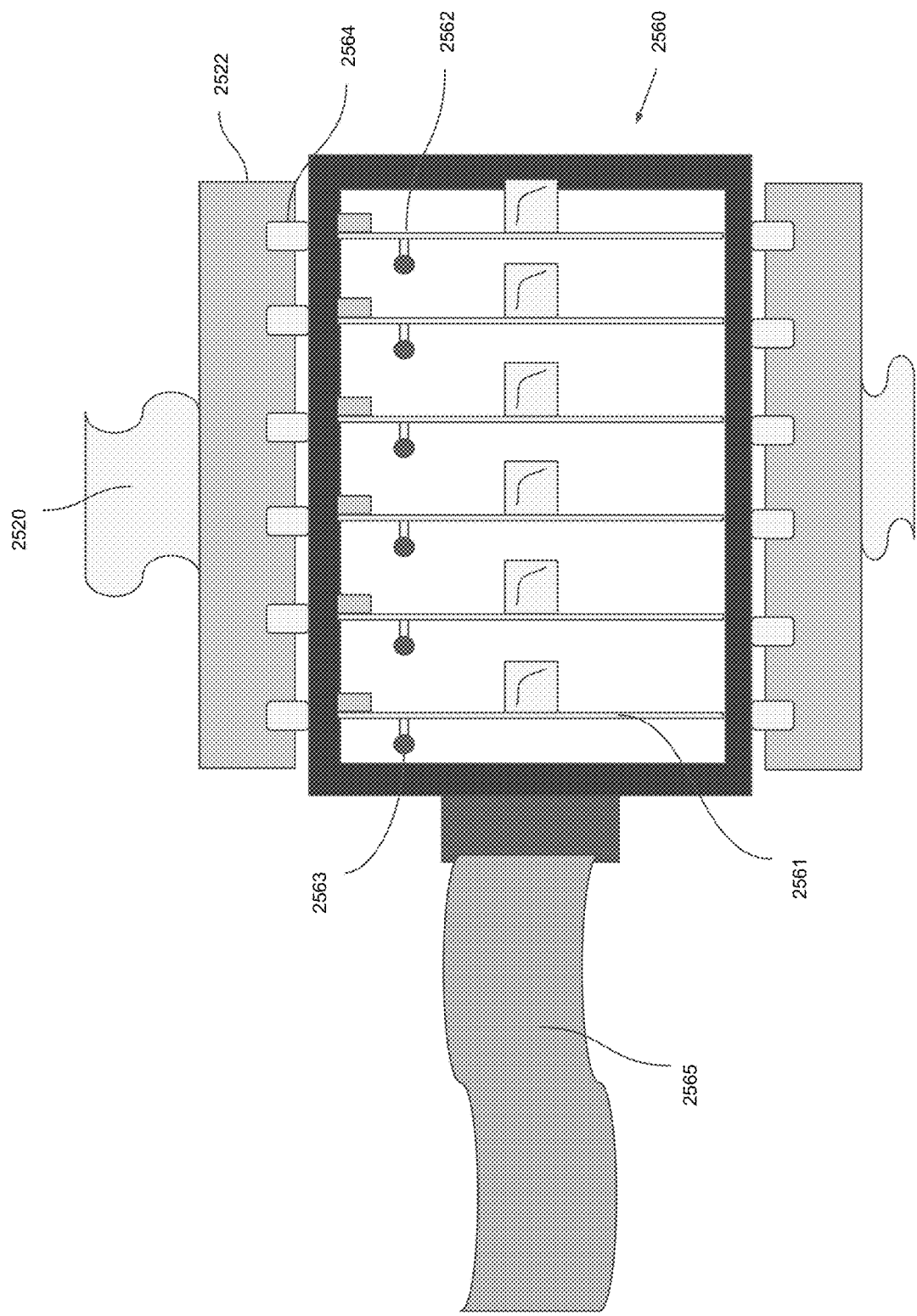
FIG. 25 shows a further example of a signal conditioning module connected to high frequency signal flex cables and a low frequency signal shielded twisted pair cable.

FIG. 25 shows a further example of a signal conditioning module 2560 for which high frequency flex cables 2520 are used to bring the high frequency signals in and out of the module 2560 and in this particular example the flex cables 2520 are terminated with rigid boards 2522 and electrical connection between the rigid boards 2522 and the module 2560 is by push on connectors 2564 with blindmates, although compliant joints and flex cables, as configured in FIG. 24 for example, could be used instead. Low frequency and DC signals are shown provided by a low frequency shielded twisted pair (DC) cable 2565. The signal conditioning module 2560 comprises a PCB, low pass and high pass filters for each signal line 2561, and a metal enclosure, such as an OFHC copper housing. The filter circuits are shown in a bias tee configuration 2562 with the low frequency signal for each circuit being provided from the backside of the PCB with a feedthrough 2563. (In the embodiment shown each of the high frequency filter circuits can be supplied with a unique DC line from the DC cable.)

Figure 26:
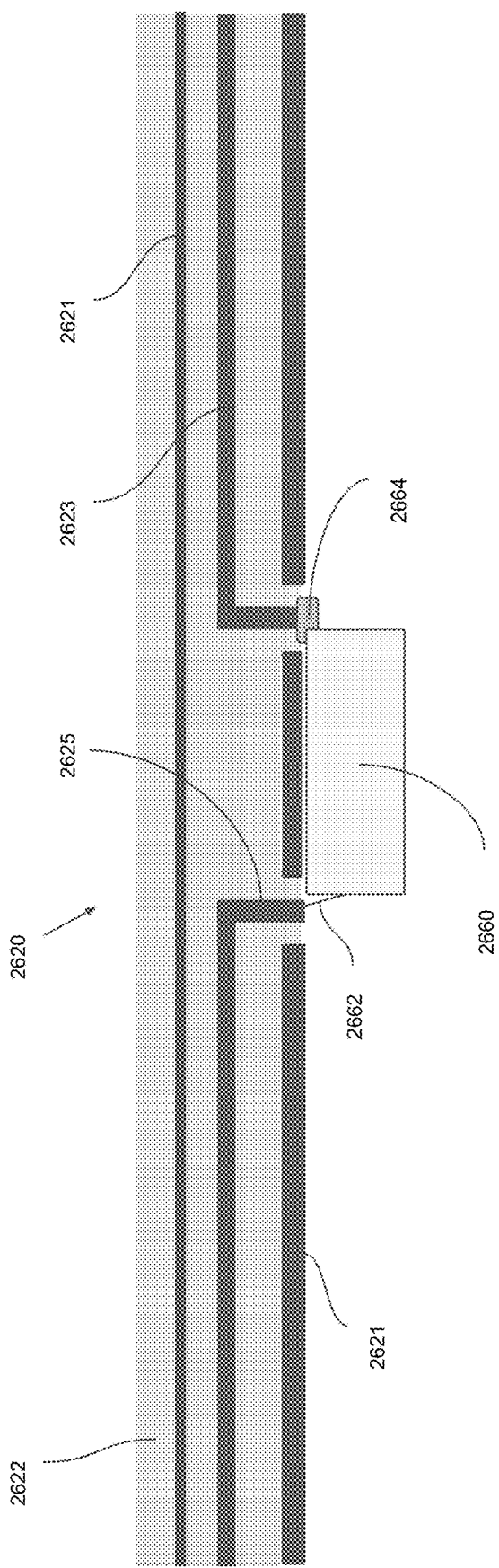
FIG. 26 shows a cross-sectional representation of a detail of a flex cable with an electrical component directly attached.

FIG. 26 shows a flex cable 2620 with a component 2660 attached directly to the flex cable surface, using either wire bonding 2662, soldering 2664, or a conductive adhesive (such as a conductive epoxy). A stiffener 2622 is also shown on the opposite side of the flex from the component 2660. Examples of components that might be attached to the flex cables include attenuators, filters, amplifiers, circulators and isolators. Ground planes 2621, striplines 2623 and stripline vias 2625 are shown in the figure.

Figure 27:
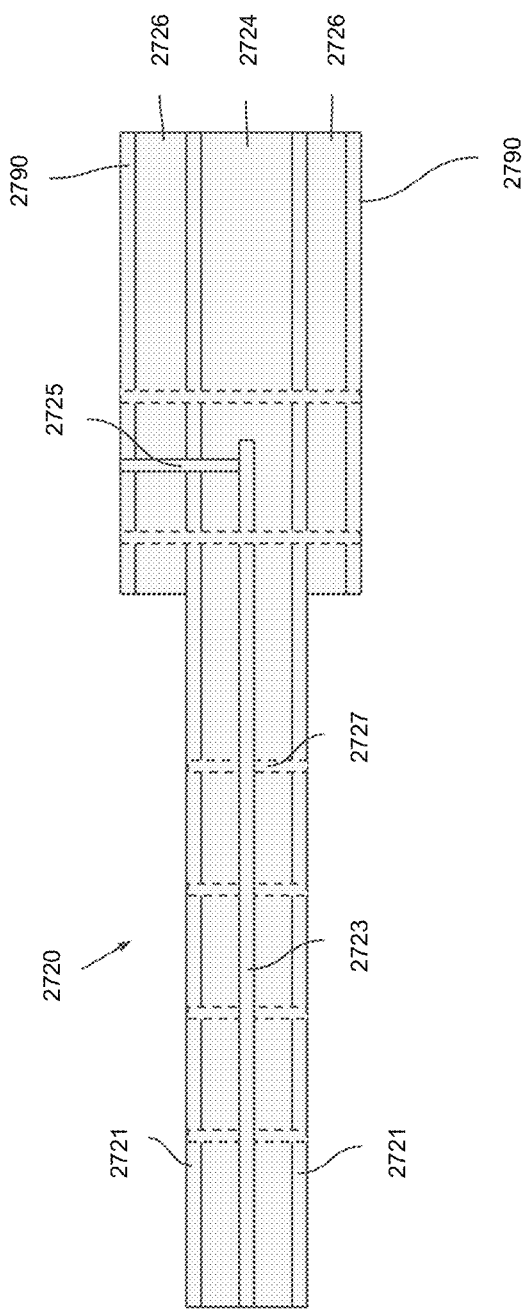
FIG. 27 shows a cross-sectional representation of a flex cable with integrated stiffener at an end portion of the flex.

FIG. 27 shows a cross-sectional view of a flex cable 2720 with stiffener material 2726 laminated to an end portion on the top and bottom surfaces, although the stiffener may be laminated to just a single side in some embodiments. The ground planes 2721 and 2790, striplines 2723, stiffener layers 2726, stripline vias 2725 and vias 2727—which connect to the ground planes 2721 and provide electromagnetic screening of the striplines 2723—are shown. Materials used for the ground planes 2721, 2790 may be copper, copper alloys, aluminum, stainless steel, nickel alloys, niobium, etc. Materials used for the striplines 2723 may be copper, copper alloys, aluminum, stainless steel, nickel alloys, niobium, etc. Materials used for the vias 2725 and 2727 may be copper, copper alloys, aluminum, stainless steel, nickel alloys, niobium, etc. Materials used for the dielectrics 2724 and 2726 may be polyimide, teflon, lcp (liquid crystal polymer), fiberglass composite such as Rogers Material, FR4, Panasonic Megtron). Combinations such as brass ground planes, brass stripline, copper vias and polyimide dielectric leverage current manufacturing processes. Alternatively, aluminum ground places, aluminum striplines, copper vias and polyimide dielectric may be used. Other configurations may include niobium ground plane, niobium strip line, copper vias and polyimide dielectric.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

According to further aspects of the invention:

[Clause 1] A flexible cable comprising:
 a flexible strip with first and second parallel surfaces and first and second ends, said flexible strip being electrically insulating;
 a metal stripline within said flexible strip;
 first and second metallic grounding planes on said first and second surfaces, respectively; and
 a first circuit board mechanically attached to at least one of said first end of said flexible strip and said first and second metallic grounding planes at said first end, said first circuit board being mechanically stiff, said metal stripline being electrically connected to electrical circuitry on said first circuit board.

[Clause 2] The flexible cable of clause 1, wherein said metal stripline is formed of superconducting material.

[Clause 3] The flexible cable of clause 2, wherein said metal stripline comprises a type-one superconducting metal.

[Clause 4] The flexible cable of clause 2, wherein said metal stripline comprises a type-two superconducting metal.

[Clause 5] The flexible cable of clause 1, wherein said electrical circuitry on said first circuit board comprises a radio frequency coaxial connector.

[Clause 6] The flexible cable of clause 1, wherein said electrical circuitry on said first circuit board comprises a radio frequency filter.

[Clause 7] The flexible cable of clause 1, wherein said electrical circuitry on said first circuit board comprises a signal attenuator.

[Clause 8] The flexible cable of clause 1, further comprising a second metal stripline parallel to said metal stripline along the length of said flexible strip.

[Clause 9] The flexible cable of clause 1, further comprising a multiplicity of metallic vias through said flexible strip connecting said first and second metallic grounding planes, said metallic vias being arrayed on both sides of said metal stripline, wherein said metal stripline is within an electromagnetically shielded volume defined by said multiplicity of metallic vias and said first and second grounding planes

[Clause 10] The flexible cable of clause 9, further comprising a second metal stripline parallel to said metal stripline along the length of said flexible strip, said metallic vias being arrayed on both sides of and between said metal stripline and said second metal stripline, wherein said metal stripline and said second metal stripline are within an electromagnetically shielded volume defined by said multiplicity of metallic vias and said first and second grounding planes.

[Clause 11] The flexible cable of clause 8, wherein said first end of said flexible strip broadens towards said first end, and said first metal stripline and said second metal stripline fan out towards said first end.

[Clause 12] The flexible cable of clause 1, wherein said flexible strip comprises polyimide.

[Clause 13] The flexible cable of clause 1, wherein said flexible strip comprises kapton.

[Clause 14] The flexible cable of clause 9, wherein said electromagnetic shielding is over at least a range comprising microwave frequencies.

[Clause 15] The flexible cable of clause 1, wherein said first end of said flexible strip is mechanically attached to said first circuit board at a plurality of points uniformly distributed over an overlap area of said flexible strip and said first circuit board.

[Clause 16] The flexible cable of clause 1, further comprising a second circuit board mechanically attached to at least one of said second end of said flexible strip and said first and second metallic grounding planes at said second end, said second circuit board being mechanically stiff, said metal stripline being electrically connected to electrical circuitry on said second circuit board.

[Clause 17] The flexible cable of clause 1, wherein said flexible strip comprises a composite material, said composite material comprising an insulating material and metallic particles for absorption of high-frequency electromagnetic waves.

[Clause 18] The flexible cable of clause 1, further comprising:
- a second flexible strip on said second metallic grounding plane, a third metallic grounding plane on the surface of said second flexible strip wherein said second and third metallic grounding planes are parallel, said flexible strip being electrically insulating; and
- a second layer metal stripline within said second flexible strip;
- wherein said second layer metal stripline is electrically connected to electrical circuitry on said first circuit board.

[Clause 19] The flexible cable of clause 9, further comprising:
- a second flexible strip on said second metallic grounding plane, a third metallic grounding plane on the surface of said second flexible strip wherein said second and third metallic grounding planes are parallel, said flexible strip being electrically insulating;
  - a second multiplicity of metallic vias through said flexible strip connecting said third and second metallic grounding planes, said metallic vias being arrayed on both sides of said second layer metal stripline, wherein said second layer metal stripline is within an electromagnetically shielded volume defined by said second multiplicity of metallic vias and said third and second grounding planes; and
  - a second layer metal stripline within said second flexible strip;
  - wherein said second layer metal stripline is electrically connected to electrical circuitry on said first circuit board.

[Clause 20] A cryogenic system comprising:
- a plurality of isothermal plates; and
- at least one flexible cable of any one of clauses 1 to 19;
- wherein said first circuit board is mechanically and thermally connected to one of said plurality of isothermal plates.

[Clause 21] The cryogenic system of clause 20, further comprising a quantum processing unit electrically connected to said at least one flexible electromagnetically shielded cable, said quantum processing unit comprising superconducting circuits, wherein said cryogenic system is configured for said flexible electromagnetically shielded cable to carry one or more signals to said quantum processing unit.

[Clause 22] The cryogenic system of clause 21, wherein said quantum processing unit comprises greater than or equal to fifty quantum bits.

[Clause 23] The cryogenic system of clause 21, wherein said quantum processing unit comprises greater than or equal to one hundred quantum bits.

[Clause 24] The cryogenic system of clause 21, wherein said quantum processing unit is mechanically attached to said second circuit board of said at least one flexible electromagnetically shielded cable.

[Clause 25] The cryogenic system of clause 21, wherein said at least one flexible electromagnetically shielded cable passes through all of said plurality of isothermal plates, including said mixing plate, except for a room temperature plate, said first circuit board being mechanically and thermally connected to said room temperature plate.

[Clause 26] A cryogenic system comprising:
- a plurality of isothermal plates;
- at least one flexible cable of clauses 1 and 19; and
- a first rigid board comprising a region of electromagnetically absorptive material;
- wherein said first circuit board is mechanically and thermally connected to an ambient temperature isothermal plate, and said second circuit board is mechanically attached to a quantum processing unit; wherein a first window is created in said first metallic grounding plane; wherein said flexible cable and said rigid board are clamped to a mixing plate, said rigid board being in good thermal contact with said mixing plate; and wherein said region of absorptive material is immediately adjacent to and facing said first window.

[Clause 27] The cryogenic system of clause 26 further comprising:
- a second rigid board comprising a region of electromagnetically absorptive material;
- wherein a second window is created in said second metallic grounding plane, said second window being opposite said first window; wherein said flexible cable and said first and second rigid boards are clamped to a mixing plate, said rigid boards being in good thermal contact with said mixing plate; and wherein said first and second regions of absorptive material are immediately adjacent to and facing said first and second windows, respectively.

[Clause 28] The flexible electromagnetically shielded cable of clause 1, wherein said first metallic grounding plane has a first window.

[Clause 29] The flexible electromagnetically shielded cable of clause 28, further comprising:
- a first rigid board comprising a first region of electromagnetically absorptive material;
- wherein said flexible cable and said rigid board are held together, and wherein said first regions of absorptive material are immediately adjacent to and facing said first windows.

[Clause 30] The flexible electromagnetically shielded cable of clause 1, wherein said first metallic grounding plane has a first window and said second metallic grounding plane has a second window, said second window being opposite said first window.

[Clause 31] The flexible electromagnetically shielded cable of clause 30, further comprising:
- a first rigid board comprising a first region of electromagnetically absorptive material and a second rigid board comprising a second region of electromagnetically absorptive material;
- wherein said flexible cable and said rigid boards are held together, and wherein said first and second regions of absorptive material are immediately adjacent to and facing said first and second windows, respectively.

[Clause 32] A flexible cable comprising:
- a flexible strip with first and second parallel surfaces and first and second ends, said flexible strip being electrically insulating;
- a metal stripline within said flexible strip;
- first and second metallic grounding planes on said first and second surfaces, respectively; and a mechanical stiffener attached to at least one of said first end of said flexible strip and said first and second metallic grounding planes at said first end.

[Clause 33] A flexible cable system comprising:
a first flexible cable as described in any clause, wherein the first flexible cable comprises one or more of stripline and grounding plane being formed of non-superconducting metal;
a second flexible cable as described in any clause, wherein the second flexible cable comprises one or more of stripline and grounding plane being formed of superconducting metal; and
an electrical connector providing electrical connection of the first and second flexible cables.

[Clause 34] A flexible cable of clause 33, wherein said non-superconducting metal is stainless steel.

[Clause 35] A flexible cable of clause 33, wherein said superconducting metal is Nb or TiNb.

[Clause 36] A flexible cable as in clause 35, wherein the electrical connector is at or below a 4 Kelvin stage of a cryostat, wherein the second flexible cable is in an environment at 4 Kelvin or less.

[Clause 37] A flexible cable of clause 33, wherein the electrical connector is a compliant joint.

[Clause 38] A cryogenic system comprising:
a plurality of isothermal plates;
at least one flexible cable of clause 32 or one flexible cable system of clauses 33-37;
a quantum processing unit electrically connected to said at least one flexible cable, said quantum processing unit comprising superconducting circuits, wherein said cryogenic system is configured for said flexible cable to carry one or more signals to said quantum processing unit;
and an electrical connector providing electrical connection of the at least one flexible cable and said quantum processing unit.

[Clause 39] A cryogenic system of clause 38, wherein the electrical connector is a compliant joint.

[Clause 40] The cryogenic system of clause 38, wherein said quantum processing unit comprises greater than or equal to fifty quantum bits.

[Clause 41] The cryogenic system of clause 38, wherein said quantum processing unit comprises greater than or equal to one hundred quantum bits.

A number of embodiments have been described. Nevertheless, it will be understood that various modifications can be made. Accordingly, other embodiments are within the scope of the following claims.

What is claimed is:

1. A flexible cable comprising:
a flexible strip with first and second parallel surfaces and first and second ends, the flexible strip being electrically insulating;
a first metal stripline within the flexible strip;
first and second metallic grounding planes on the first and second parallel surfaces, respectively; and
a mechanical stiffener material attached to at least an end portion of one of the first and second ends of the flexible cable to at least one of the first and second metallic grounding planes, wherein the mechanical stiffener material comprises a fiberglass composite.

2. The flexible cable of claim 1, wherein the metal stripline is formed of superconducting material.

3. The flexible cable of claim 2, wherein the metal stripline comprises a type-one superconducting metal.

4. The flexible cable of claim 2, wherein the metal stripline comprises a type-two superconducting metal.

5. The flexible cable of claim 1, further comprising a second metal stripline parallel to the metal stripline along a length of the flexible strip.

6. The flexible cable of claim 1, further comprising a multiplicity of metallic vias through the flexible strip connecting the first and second metallic grounding planes, the metallic vias being arrayed on both sides of the metal stripline, wherein the metal stripline is within an electromagnetically shielded volume defined by the multiplicity of metallic vias and the first and second grounding planes.

7. The flexible cable of claim 6, further comprising a second metal stripline parallel to the metal stripline along a length of the flexible strip, the metallic vias being arrayed on both sides of and between the metal stripline and the second metal stripline, wherein the metal stripline and the second metal stripline are within an electromagnetically shielded volume defined by the multiplicity of metallic vias and the first and second grounding planes.

8. The flexible cable of claim 1, wherein the flexible strip comprises polyimide.

9. The flexible cable of claim 1, wherein the flexible strip comprises KAPTON®.

10. The flexible cable of claim 6, wherein the electromagnetic shielding is over at least a range comprising microwave frequencies.

11. The flexible cable of claim 1, wherein the flexible strip comprises a composite material, the composite material comprising an insulating material and metallic particles for absorption of high-frequency electromagnetic waves.

12. The flexible cable of claim 1, further comprising:
a second flexible strip on the second metallic grounding plane, a third metallic grounding plane on the surface of the second flexible strip wherein the second and third metallic grounding planes are parallel, the flexible strip being electrically insulating; and
a second layer metal stripline within the second flexible strip; and
wherein the second layer metal stripline is electrically connected to electrical circuitry on a first circuit board.

13. The flexible cable of claim 6, further comprising:
a second flexible strip on the second metallic grounding plane, a third metallic grounding plane on the surface of the second flexible strip wherein the second and third metallic grounding planes are parallel, the flexible strip being electrically insulating;
a second multiplicity of metallic vias through the flexible strip connecting the third and second metallic grounding planes, the metallic vias being arrayed on both sides of the second layer metal stripline, wherein the second layer metal stripline is within an electromagnetically shielded volume defined by the second multiplicity of metallic vias and the third and second grounding planes;
a second layer metal stripline within the second flexible strip; and
wherein the second layer metal stripline is electrically connected to electrical circuitry on a first circuit board.

14. A cryogenic system comprising:
a plurality of isothermal plates; and
at least one flexible cable comprising:
a flexible strip with first and second parallel surfaces and first and second ends, the flexible strip being electrically insulating;
a first metal stripline within the flexible strip;

first and second metallic grounding planes on the first and second parallel surfaces, respectively; and a mechanical stiffener material attached to at least an end portion of one of the first and second ends of the flexible cable to at least one of the first and second metallic grounding planes; and a quantum processing unit electrically connected to the at least one flexible cable at the first end, the quantum processing unit comprising superconducting circuits, wherein the cryogenic system is configured for the flexible cable to carry one or more signals to the quantum processing unit; and an electrical connector providing electrical connection of the at least one flexible cable and the quantum processing unit.

15. The cryogenic system of claim 14, wherein the quantum processing unit comprises greater than or equal to fifty quantum bits.

16. The cryogenic system of claim 14, wherein the quantum processing unit comprises greater than or equal to one hundred quantum bits.

17. The cryogenic system of claim 14, wherein the at least one flexible cable passes through all of the plurality of isothermal plates, including a mixing plate, except for a room temperature plate, the second end being mechanically and thermally connected to the room temperature plate.

18. The cryogenic system of claim 14, wherein the electrical connector is a compliant joint.

* * * * *